(12) United States Patent
Choi et al.

(10) Patent No.: US 11,929,118 B2
(45) Date of Patent: Mar. 12, 2024

(54) NON-VOLATILE MEMORY DEVICE

(71) Applicant: Samsung Electronics Co., Ltd., Suwon-si (KR)

(72) Inventors: Yonghyuk Choi, Suwon-si (KR); Yohan Lee, Incheon (KR); Sangwon Park, Seoul (KR); Jaeduk Yu, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 85 days.

(21) Appl. No.: 17/748,156

(22) Filed: May 19, 2022

(65) Prior Publication Data

US 2023/0138604 A1    May 4, 2023

(30) Foreign Application Priority Data

Oct. 28, 2021  (KR) .................. 10-2021-0145856

(51) Int. Cl.
| | |
|---|---|
| *G11C 16/04* | (2006.01) |
| *G11C 7/10* | (2006.01) |
| *G11C 16/08* | (2006.01) |
| *G11C 16/10* | (2006.01) |
| *G11C 16/24* | (2006.01) |
| *G11C 16/26* | (2006.01) |

(52) U.S. Cl.
CPC ........ *G11C 16/0433* (2013.01); *G11C 7/1039* (2013.01); *G11C 16/08* (2013.01); *G11C 16/102* (2013.01); *G11C 16/24* (2013.01); *G11C 16/26* (2013.01)

(58) Field of Classification Search
CPC .................................................. G11C 16/04

USPC .................................................. 365/189.011
See application file for complete search history.

(56) References Cited

U.S. PATENT DOCUMENTS

| | | |
|---|---|---|
| 7,679,133 B2 | 3/2010 | Son et al. |
| 8,553,466 B2 | 10/2013 | Han et al. |
| 8,559,235 B2 | 10/2013 | Yoon et al. |
| 8,654,587 B2 | 2/2014 | Yoon et al. |

(Continued)

FOREIGN PATENT DOCUMENTS

JP   2001-101880 A   4/2001

OTHER PUBLICATIONS

EESR dated Nov. 2, 2022 for corresponding EP Patent Application No. 22176644.7.

*Primary Examiner* — Muna A Techane
(74) *Attorney, Agent, or Firm* — Harness, Dickey & Pierce, P.L.C.

(57) ABSTRACT

Provided is a non-volatile memory device including a memory cell array including cell strings each including memory cells and a string select transistor connected to a string select line; a page buffer circuit including page buffers each including a forcing latch configured to store forcing information; and a control logic circuit configured to, during a program operation on a selected word line, control at least two of a first voltage applied to the string select line in a first interval before a bit line forcing operation for transferring the forcing information to the selected cell string, a second voltage applied to the string select line in a second interval in which the bit line forcing operation is performed, and a third voltage applied to the string select line in a third interval after the bit line forcing operation is performed, to be different from each other.

20 Claims, 23 Drawing Sheets

(56) References Cited

U.S. PATENT DOCUMENTS

| | | |
|---|---|---|
| 8,923,061 B2 | 12/2014 | Kim |
| 9,230,659 B2 | 1/2016 | Choi et al. |
| 10,157,674 B2 | 12/2018 | Kim et al. |
| 10,629,267 B2 | 4/2020 | Lee et al. |
| 10,832,782 B2 | 11/2020 | Park |
| 2011/0233648 A1 | 9/2011 | Seol et al. |
| 2012/0026797 A1 | 2/2012 | Kim |
| 2013/0182505 A1 | 7/2013 | Liu et al. |
| 2013/0322171 A1 * | 12/2013 | Lee ........................ G11C 29/04 365/185.03 |
| 2018/0144800 A1 * | 5/2018 | Park ........................ G11C 16/10 |
| 2020/0202947 A1 | 6/2020 | Kim et al. |
| 2020/0357476 A1 | 11/2020 | Kim et al. |

* cited by examiner

FIG. 11B

| WLG | WL | BLSETUP | PGMEXE | | |
|---|---|---|---|---|---|
| | | | INT1 (Before BL Forcing) | INT2 (While BL Forcing) | INT3 (After BL Forcing) |
| GRa | WL1 ~ WLk | V4a | V1a | V2a | V3a |
| GRb | WLk+1 ~ WLn | V4b | V1b | V2b | V3b |

FIG. 12B

| WLG | WL | BLSETUP | PGMEXE | | |
|---|---|---|---|---|---|
| | | | INT1 (Before BL Forcing) | INT2 (While BL Forcing) | INT3 (After BL Forcing) |
| GRa | WL1 ~ WLa | V4a | V1a | V2a | V3a |
| GRb | WLa+1 ~ WLb | V4b | V1b | V2b | V3b |
| GRc | WLb+1 ~ WLc | V4c | V1c | V2c | V3c |
| GRd | WLc+1 ~ WLn | V4d | V1d | V2d | V3d |

FIG. 15B

| WLG | WL | BLSHF control during PGMEXE | | |
|---|---|---|---|---|
| | | Delay | Step | Cycle |
| GRa | WL1 ~ WLk | Ta | Va | T'a |
| GRb | WLk+1 ~ WLn | Tb | Vb | T'b |

NON-VOLATILE MEMORY DEVICE

CROSS-REFERENCE TO RELATED APPLICATION

This application is based on and claims priority under 35 U.S.C. § 119 to Korean Patent Application No. 10-2021-0145856, filed on Oct. 28, 2021, in the Korean Intellectual Property Office, the disclosure of which is incorporated by reference herein in its entirety.

BACKGROUND

The inventive concepts relate to memory devices, and more particularly, to non-volatile memory devices having a cell string corresponding to a vertical channel structure.

Memory devices are used to store data and are categorized into volatile memory devices and non-volatile memory devices. In response to the demand for increased capacity and miniaturization of non-volatile memory devices, a 3D memory device including a plurality of vertical channel structures extending in a vertical direction on a substrate has been developed. In order to further improve the degree of integration of a 3D memory device, as the number of a plurality of word lines vertically stacked on a substrate increases, the length of each vertical channel structure may increase. As the length of the vertical channel structure increases, a channel recovery degradation phenomenon in which a bit line voltage is not properly transmitted throughout a channel region may occur.

SUMMARY

The inventive concepts provide non-volatile memory devices capable of improving performance by smoothly performing channel recovery throughout a channel region despite an increase in the length or the resistance of the channel region of the non-volatile memory device.

According to an aspect of the inventive concepts, there is provided non-volatile memory devices including a memory cell array including a plurality of cell strings, each cell string extending in a vertical direction above a substrate and each cell string including a plurality of memory cells respectively connected to a plurality of word lines and a string select transistor connected to a string select line; a page buffer circuit including a plurality of page buffers connected to the memory cell array, each page buffer including a forcing latch configured to store forcing information and each page buffer is connected to a selected cell string through a bit line; and a control logic circuit configured to, during a program operation on a selected word line, control at least two of a first voltage applied to the string select line in a first interval before a bit line forcing operation for transferring the forcing information to the selected cell string through the bit line, a second voltage applied to the string select line in a second interval in which the bit line forcing operation is performed, and a third voltage applied to the string select line in a third interval after the bit line forcing operation is performed, to be different from each other.

According to another aspect of the inventive concepts, there is provided a non-volatile memory device including a plurality of word lines including a first word line relatively close to a substrate and a second word line relatively far from the substrate; a memory cell array including a plurality of cell strings, each cell string extending in a vertical direction above the substrate and each including a plurality of memory cells respectively connected to the word lines; a page buffer circuit including a plurality of page buffers connected to the memory cell array, each page buffer being connected to a selected cell string through a bit line and including a bit line shut-off transistor configured to be driven in response to a bit line shut-off signal and a forcing latch configured to store forcing information; and a control logic circuit configured to, during a program operation on a selected word line, controls a delay interval in which a bit line shut-off voltage corresponding to the bit line shut-off signal maintains a voltage level corresponding to a ground voltage before a bit line forcing operation of transferring the forcing information to the selected cell string through the bit line is performed, a length of the delay interval based on the selected word line corresponding to the first word line being longer than a length of the delay interval based on the selected word line corresponding to the second word line.

According to another aspect of the inventive concepts, there is provided a non-volatile memory device including a plurality of word lines including a first group including word lines relatively close to a substrate and a second group including word lines relatively far from the substrate; a string select line above the word lines; a memory cell array including a plurality of cell strings, each cell string extending in a vertical direction above the substrate and each call string being connected to the plurality of word lines and the string select line; a page buffer circuit including a plurality of page buffers connected to the memory cell array, each page buffer being connected to a selected cell string through a bit line and including a bit line shut-off transistor configured to be driven in response to a bit line shut-off signal and a forcing latch configured to store forcing information; and a control logic circuit configured to, in a program operation on a selected word line, control a voltage applied to the string select line to perform a bit line forcing operation of transferring the forcing information to the selected cell string through the bit line and a bit line shut-off voltage corresponding to the bit line shut-off signal, the control logic circuit is configured to control a first voltage applied to the string select line in a first interval before the bit line forcing operation is performed differently with respect to the first group and the second group, and control a delay interval in which the bit line shut-off voltage maintains a voltage level corresponding to a ground voltage before the bit line forcing operation is performed differently with respect to the first group and the second group.

BRIEF DESCRIPTION OF THE DRAWINGS

Embodiments of the inventive concepts will be more clearly understood from the following detailed description taken in conjunction with the accompanying drawings in which:

FIG. 11B is table showing a voltage applied to a string select line according to a selected word line during a program operation of the memory device of FIG. 11A, according to some example embodiments of the inventive concepts;

FIG. 12B is table showing a voltage applied to a string select line according to a selected word line during a program operation of the memory device of FIG. 12A, according to some example embodiments of the inventive concepts;

FIG. 15B shows a control operation of a bit line selection signal according to a selected word line during a program operation according to some example embodiments of the inventive concepts;

DETAILED DESCRIPTION OF THE EMBODIMENTS

Figure 1:
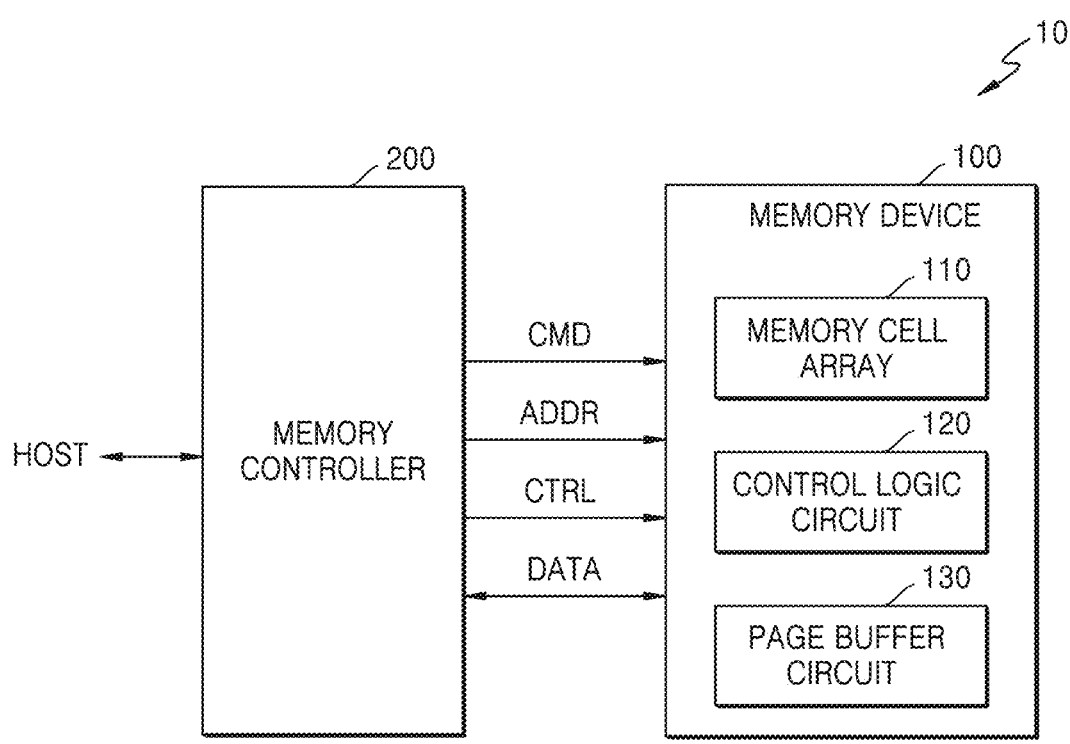
FIG. 1 is a block diagram showing a memory system according to some example embodiments of the inventive concepts.

FIG. 1 is a block diagram showing a memory system 10 according to some example embodiments of the inventive concepts.

Referring to FIG. 1, the memory system 10 may include a memory device 100 and a memory controller 200, and the memory device 100 may include a memory cell array 110, a control logic circuit 120, and a page buffer circuit 130. The memory device 100 may be a non-volatile memory device, and, in this specification, the term "memory device" will refer to a "non-volatile memory device".

The memory controller 200 may control the memory device 100 to read data stored in the memory device 100 or program data to the memory device 100 in response to a read/write request from a host HOST. In detail, the memory controller 200 may provide an address ADDR, a command CMD, and a control signal CTRL to the memory device 100, thereby controlling a program operation, a read operation, and an erase operation for the memory device 100. Also, data DATA to be programmed and read data DATA may be transmitted and received between the memory controller 200 and the memory device 100.

The memory cell array 110 may include a plurality of memory cells. For example, the memory cells may be flash memory cells. Hereinafter, example embodiments of the inventive concepts will be described in detail based on an example case where the memory cells are NAND flash memory cells. However, the inventive concepts are not limited thereto, and, in some example embodiments, the memory cells may be resistive memory cells like resistive RAM (ReRAM) cells, phase change RAM (PRAM) cells, and magnetic RAM (MRAM) cells.

The control logic circuit 120 may receive a command CMD, an address ADDR, and a control signal CTRL from the memory controller 200 and control the overall operation of the memory device 100 based on the command CMD, the address ADDR, and the control signal CTRL. The page buffer circuit 130 may include a plurality of page buffers (e.g., PB1 to PBm of FIG. 2). In some example embodiments, each page buffer may include a forcing latch (e.g., 134 of FIG. 8) that stores bit line forcing information (hereinafter referred to as "forcing information"). In some example embodiments, each page buffer may further include a bit line shut-off transistor (e.g., NM1 of FIG. 8).

In some example embodiments, when the command CMD is a program command, the control logic circuit 120 may control a string select line voltage applied to a string select line corresponding to the address ADDR from among string select lines (e.g., SSL1 to SSL3 of FIG. 3) connected to the memory cell array 110, in response to the program command. In detail, during a program operation on a selected word line corresponding to the address ADDR, a program execution interval may be divided into a first interval (e.g., INT1 of FIG. 10) before a bit line forcing operation is performed, a second interval (e.g., INT2 of FIG. 10) in which a bit line forcing operation is performed, and a third interval (e.g., INT3 of FIG. 10) after a bit line forcing operation is performed. In this case, the control logic circuit 120 may individually control a string select line voltage for each of first to third intervals. Therefore, initial channel recovery for a bit line forcing operation may be smoothly performed in the first interval.

In some example embodiments, the control logic circuit 120 may differently control a string select line voltage for at least one of the first to third intervals according to the position of a selected word line. For example, a plurality of word lines may include a first word line relatively close to a substrate (that is, a bottom word line) and a second word line relatively far from the substrate (that is, a top word line). In this case, a string select line voltage in a first interval of a program execution period for the top word line and a string select line voltage in a first period of a program execution period for the bottom word line may have different voltage levels. Therefore, it is possible to smoothly perform channel recovery for a bit line forcing operation even during a program operation on the bottom word line relatively far from a bit line.

In some example embodiments, when the command CMD is a program command, the control logic circuit 120 may control the waveform of a bit line shut-off signal for driving a bit line shut-off transistor included in each page buffer of the page buffer circuit 130, in response to the program command. In detail, during a program operation on a selected word line corresponding to the address ADDR, the control logic circuit 120 may control the waveform of a bit line shut-off signal for performing a bit line forcing operation according to the position of the selected word line. Therefore, channel recovery for a bit line forcing operation may be smoothly performed, thereby improving the performance of a memory device.

Figure 2:
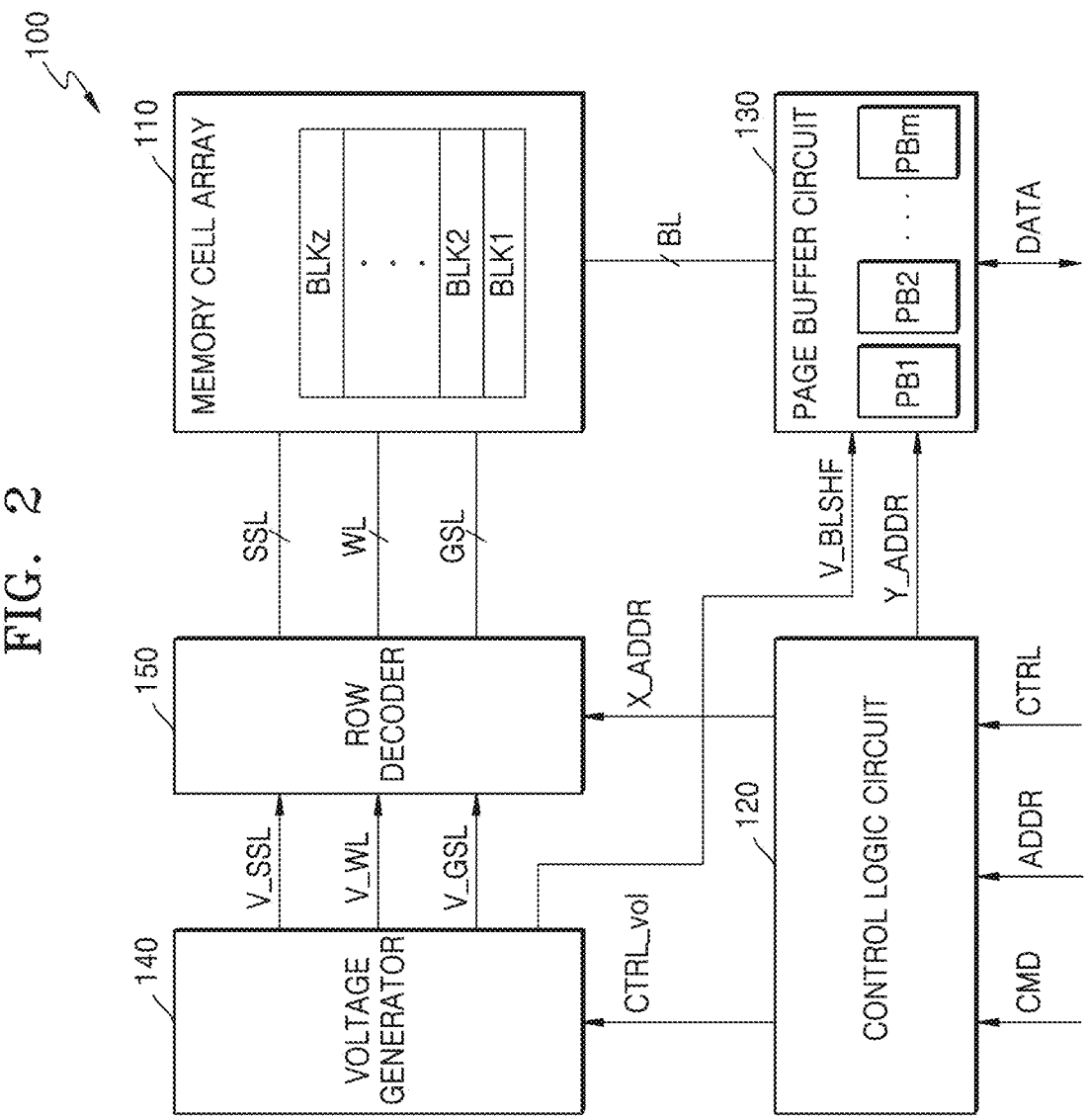
FIG. 2 is a block diagram showing a memory device according to some example embodiments of the inventive concepts.

FIG. 2 is a block diagram showing the memory device 100 according to some example embodiments of the inventive concepts.

Referring to FIG. 2, the memory device 100 may include a memory cell array 110, a control logic circuit 120, a page buffer circuit 130, a voltage generator 140, and a row decoder 150. Although not shown, the memory device 100 may further include an interface circuit, and the interface circuit may include a data input/output circuit, a command/address input/output circuit, etc. Also, the memory device 100 may further include a temperature sensor.

The memory cell array 110 may include a plurality of memory blocks BLK1 to BLKz, where z is a positive integer. The memory blocks BLK1 to BLKz may each include a plurality of pages, and the pages may each include a plurality of memory cells. For example, a memory block may be an erase unit, and a page may be a write/read unit. Each memory cell may store one or more bits, and more particularly, each memory cell may be used as a single level cell (SLC), a multi level cell (MLC), a triple level cell (TLC), or a quadruple level cell (QLC).

The memory cell array 110 may be connected to a plurality of word lines WL, a plurality of string select lines SSL, a plurality of ground select lines GSL, and a plurality of bit lines BL. The memory cell array 110 may be connected to the row decoder 150 through the word lines WL, the string select lines SSL, and the ground select lines GSL and may be connected to the page buffer circuit 130 through the bit lines BL. In some example embodiments, the memory cell array 110 may be further connected to erase control lines (e.g., GIDL_SS1 to GIDL_SS3a and/or GIDL_GS1 to GIDL_GS3 of FIG. 3).

In some example embodiments, the memory cell array 110 may include a 3-dimensional memory cell array, and the 3-dimensional memory cell array may include a plurality of cell strings or a plurality of NAND strings. Each cell string may include memory cells connected to word lines vertically stacked on a substrate, respectively. U.S. Pat. Nos. 7,679,133, 8,553,466, 8,654,587, 8,559,235, and U.S. Patent Application Publication No. 2011/0233648 are incorporated herein by reference.

The control logic circuit 120 may output various control signals for writing data to the memory cell array 110 or reading data from the memory cell array 110 based on a command CMD, an address ADDR, and a control signal CTRL received from the memory controller 200. Therefore, the control logic circuit 120 may overall control various operations within the memory device 100. In detail, the control logic circuit 120 may provide a voltage control signal CTRL_vol to the voltage generator 140, provide a row address X_ADDR to the row decoder 150, and provide a column address Y_ADDR to the page buffer circuit 130. However, the inventive concepts are not limited thereto, and the control logic circuit 120 may further provide other control signals to the voltage generator 140, the row decoder 150, and the page buffer circuit 130.

In some example embodiments, the control logic circuit 120 may control a string select line voltage to be relatively high in a first period before a bit line forcing operation is performed during a program execution interval, thereby facilitating initial channel recovery. In some example embodiments, during a program operation on the bottom word line, the control logic circuit 120 may controls the string select line voltage in the first interval to be higher than the string select line voltage in the first interval during a program operation on the top word line, and thus a bit line voltage may be smoothly transferred to a channel region relatively far from a bit line.

For example, the control logic circuit 120 may control a string select line voltage before a bit line forcing operation to be higher than a string select line voltage during a bit line setup operation. For example, the control logic circuit 120 may control a string select line voltage before a bit line forcing operation to be higher than a string select line voltage during the bit line forcing operation. For example, the control logic circuit 120 may control a string select line voltage during a bit line forcing operation to be higher than a string select line voltage after the bit line forcing operation.

In some example embodiments, in a program execution interval, the control logic circuit 120 may control the waveform of a bit line shut-off signal for driving a bit line shut-off transistor included in each page buffer of the page buffer circuit 130. In detail, the control logic circuit 120 may control a bit line shut-off voltage corresponding to a bit line shut-off signal for performing a bit line forcing operation according to the position of a selected word line. For example, the control logic circuit 120 may control a delay interval in which a bit line shut-off voltage maintains the ground voltage during a program operation on the bottom word line to be longer than a delay interval of a bit line shut-off voltage during a program operation on the top word line.

In some example embodiments, the control logic circuit 120 may control a step waveform in which the bit line shut-off voltage rises from the ground voltage to a bit line forcing voltage during a program operation. For example, the step waveform may include a plurality of steps, and the control logic circuit 120 may control cycle respectively corresponding to maintenance intervals of the respective steps. For example, the step waveform may include a plurality of steps, and the control logic circuit 120 may control at least one of steps corresponding to voltage differences between the steps.

The voltage generator 140 may generate various types of voltages for performing a program operation, a read operation, and an erase operation based on a voltage control signal CTRL_vol. In detail, the voltage generator 140 may generate a word line voltage V_WL, a string select line voltage V_SSL, and a ground select line voltage V_GSL and provide the word line voltage V_WL, the string select line voltage V_SSL, and the ground select line voltage V_GSL to the row decoder 150. Also, the voltage generator 140 may further generate a bit line shut-off voltage V_BLSHF applied to a bit line shut-off transistor and provide the bit line shut-off voltage V_BLSHF to the page buffer circuit 130.

For example, the voltage generator 140 may generate a program voltage, a pass voltage, a read voltage, a program verify voltage, or an erase voltage as the word line voltage V_WL. For example, the voltage generator 140 may generate a selection voltage or a non-selection voltage as the string select line voltage V_SSL. For example, the voltage generator 140 may generate a selection voltage or a non-selection voltage as the ground select line voltage V_GSL. Also, the voltage generator 140 may further generate a bit line voltage, a common source line voltage, etc.

Figure 10:
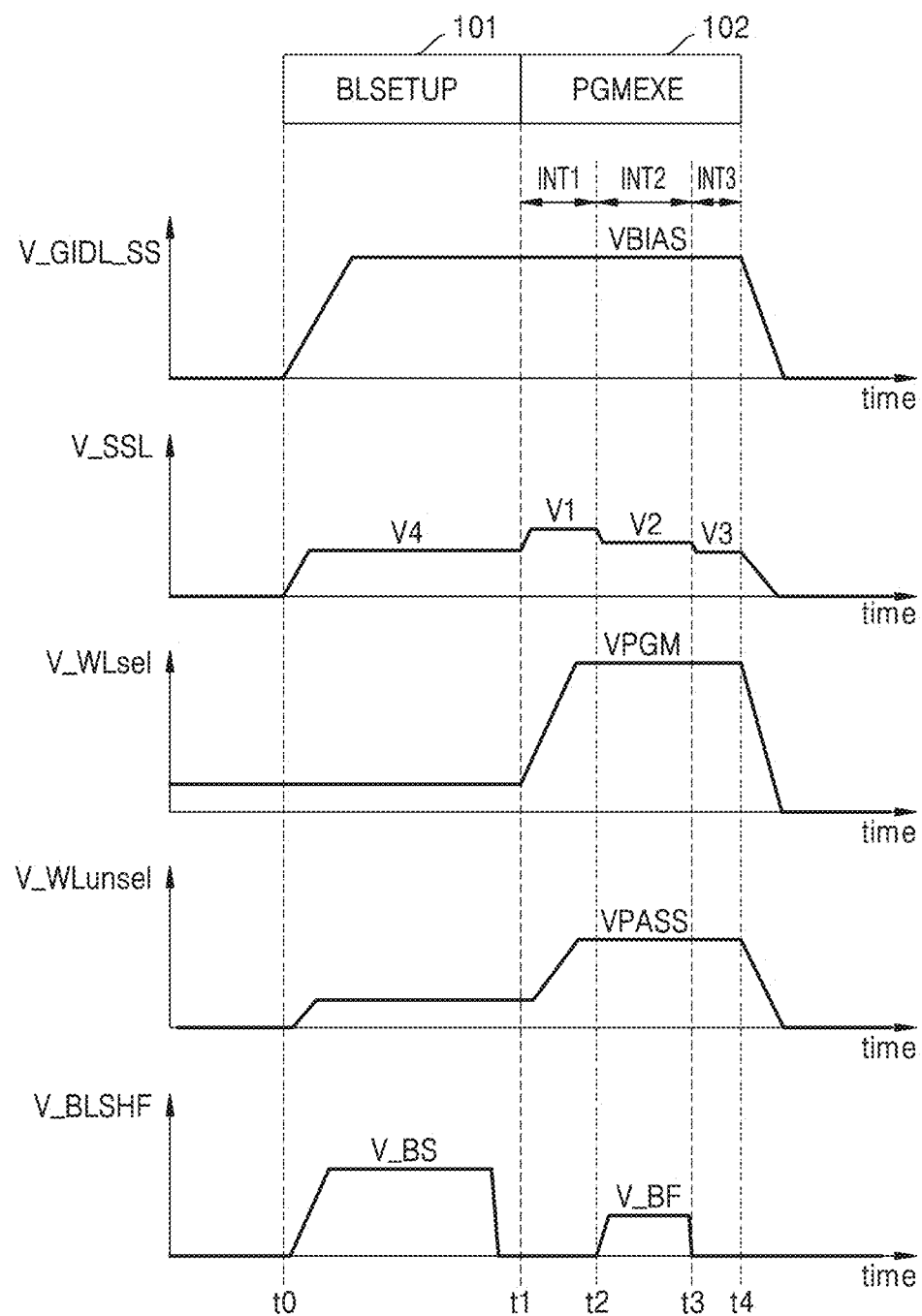
FIG. 10 is a timing diagram showing a program operation of a memory device according to some example embodiments of the inventive concepts.

In some example embodiments, based on a voltage control signal CTRL_vol, the voltage generator 140 may generate a selection voltage corresponding to the string select line voltage V_SSL as one of first to fourth voltages (V1 to V4 of FIG. 10). In some example embodiments, the voltage generator 140 may generate the bit line shut-off voltage V_BLSHF to have a step waveform that increases step-by-step based on the voltage control signal CTRL_vol. In this case, the bit line shut-off voltage V_BLSHF may include a plurality of steps, and the voltage generator 140 may generate the bit line shut-off voltage V_BLSHF, such that cycles of the respective steps and/or voltage differences between the steps are different from one another, according to the voltage control signal CTRL_vol.

The row decoder 150 may select one from among the word lines WL in response to a row address X_ADDR and may select one from among the string select lines SSL. For example, during a program operation, the row decoder 150 may apply a program voltage (e.g., VPGM of FIG. 10) to a selected word line in a program execution interval and apply a program verify voltage to the selected word line in a program verify interval. Also, in a program execution interval, the row decoder 150 may apply a first voltage V1 to a selected string select line in a first interval (e.g., INT1 of FIG. 10) before a bit line forcing operation, apply a second voltage V2 to the selected string select line in a second interval (e.g., INT2 of FIG. 10) during the bit line forcing operation, and apply a third voltage V3 to the selected string select line in a third interval (e.g., INT3 of FIG. 10) after the bit line forcing operation. For example, during a read operation, the row decoder 150 may apply a read voltage to a selected word line.

The page buffer circuit 130 may select at least one bit line BL from among the bit lines BL in response to a column address Y_ADDR. The page buffer circuit 130 may operate as a write driver or a sense amplifier depending on an operation mode. The page buffer circuit 130 may include a plurality of page buffers PB1 to PBm, where m is a positive integer. For example, m may correspond to the number of the bit lines BL, and the page buffers PB1 to PBm may be respectively connected to the bit lines BL. For example, the bit lines BL may be grouped into a plurality of bit line groups, and bit lines included in each of the bit line groups may share a page buffer.

Figure 3:
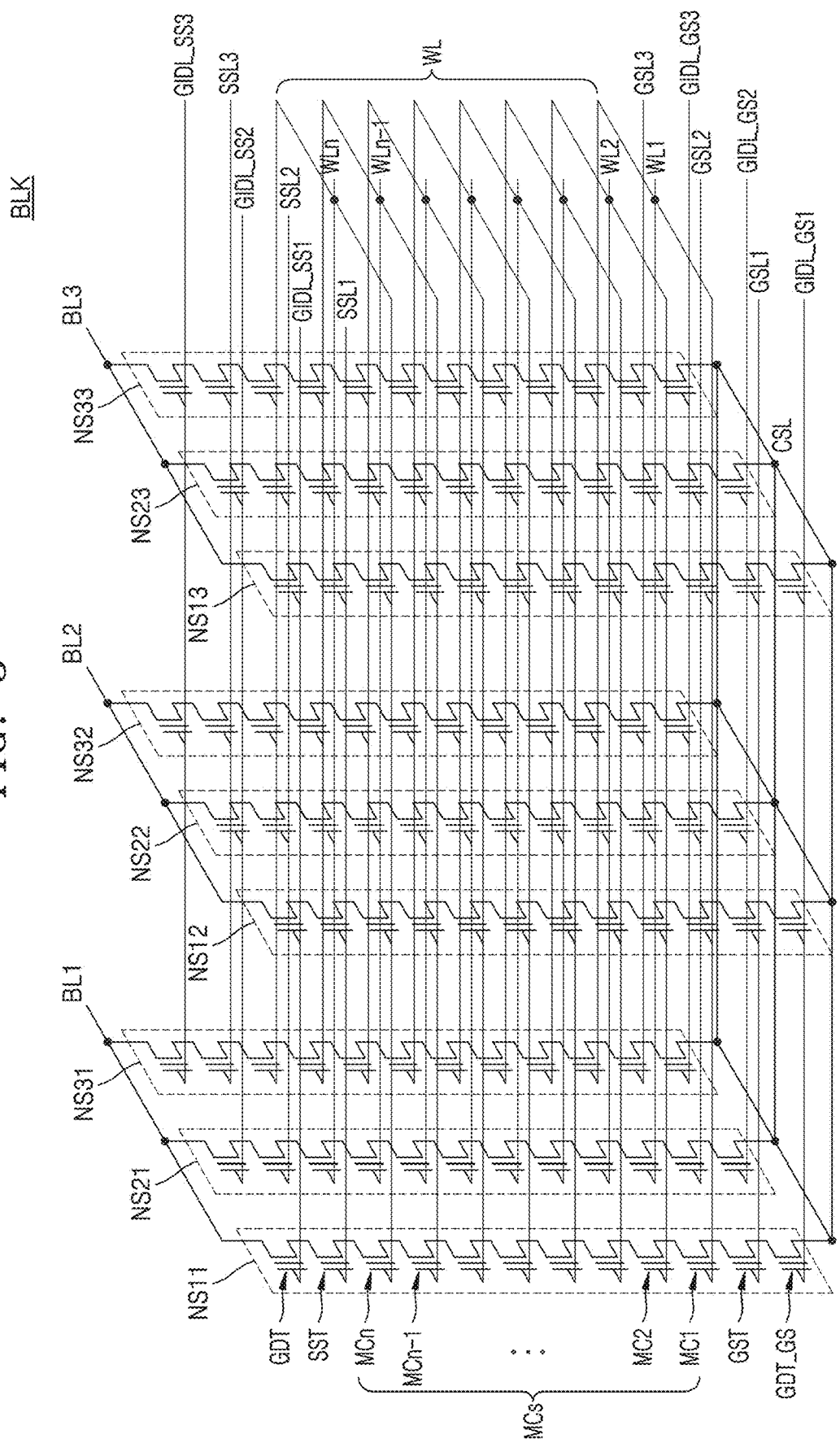
FIGS. 3 to 5 are circuit diagrams showing memory blocks according to some example embodiments of the inventive concepts, respectively.

FIG. 3 is a circuit diagram showing a memory block BLK according to some example embodiments of the inventive concepts.

Referring to FIG. 3, the memory block BLK may correspond to one of the memory blocks BLK1 to BLKz of FIG. 2. The memory block BLK may be connected to bit lines BL1 to BL3, erase control lines GIDL_SS1 to GIDL_SS3, string select lines SSL1 to SSL3, word lines WL, ground select lines GSL1 to GSL3, and erase control lines GIDL_GS1 to GIDL_GS3 and may include NAND strings (or cell strings) NS11 to NS33 extending in a vertical direction VD. Here, the number of cell strings, the number of word lines, the number of bit lines, the number of ground select lines, the number of string select lines, and the number of erase control lines may vary according to some example embodiments.

The bit lines BL1 to BL3 may extend in a first direction or a first horizontal direction HD1, and word lines WL1 to WLn may extend in a second direction or a second horizontal direction HD2, where n is a positive integer. cell strings NS11, NS21, and NS31 may be provided between a first bit line BL1 and a common source line CSL, cell strings NS12, NS22, and NS32 may be provided between a second bit line BL2 and the common source line CSL, and cell strings NS13, NS23, and NS33 may be provided between a third bit line BL3 and the common source line CSL.

For example, a cell string NS11 may include an erase control transistor GDT, a string select transistor SST, a plurality of memory cells MCs, a ground select transistor GST, and an erase control transistor GDT_GS connected in series. The erase control transistor GDT may be connected to a corresponding first bit line BL1 and a corresponding first erase control line GIDL_SS1. The string select transistor SST may be connected to a corresponding string select line S_SL1, and the memory cells MCs may be respectively connected to corresponding word lines WL1 to WLn.

The ground select transistor GST may be connected to a corresponding ground select line GSL1. The erase control transistor GDT_GS may be connected to a corresponding erase control line GIDL_GS1 and the common source line CSL. Hereinafter, the erase control lines GIDL_GS1 to GIDL_GS3 arranged below the ground select lines GSL1 to GSL3 will be referred to as "ground erase control lines", and the erase control transistor GDT_GS will be referred to as a "ground erase control transistor".

As the number of word lines WL1 to WLn increases, the length of each cell string may increase. Therefore, during a program operation on the bottom word line relatively far from the bit lines BL1 to BL3, a channel recovery degradation phenomenon in which a bit line voltage is not smoothly transferred to a channel region may occur. Also, as the erase control lines GIDL_SS1 to GIDL_SS3 are added, the erase control lines GIDL_SS1 to GIDL_SS3 may serve as resistance components, and thus channel recovery degradation may become more significant.

Figure 4:
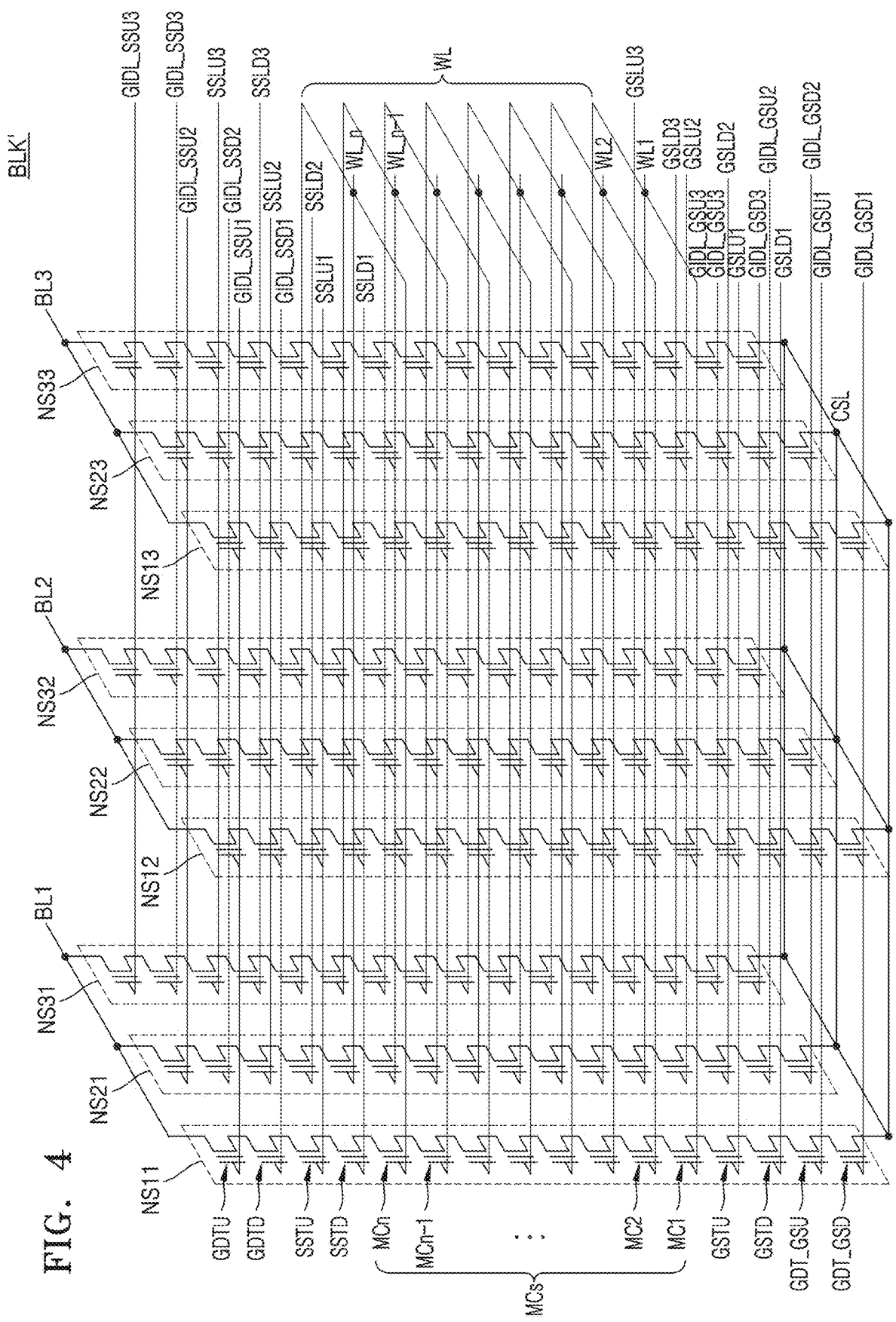

FIG. 4 is a circuit diagram showing a memory block BLK' according to some example embodiments of the inventive concepts.

Referring to FIG. 4, the memory block BLK' may correspond to one of the memory blocks BLK1 to BLKz of FIG. 2. The memory block BLK' corresponds to a modified example of the memory block BLK of FIG. 3, and hereinafter, differences from the memory block BLK of FIG. 3 will be mainly described. The memory block BLK' may be connected to the bit lines BL1 to BL3, upper erase control lines GIDL_SSU1 to GIDL_SSU3, lower erase control lines GIDL_SSD1 to GIDL_SSD3, upper string select lines SSLU1 to SSLU3, lower string select lines SSLD1 to SSLD3, the word lines WL, upper ground select lines GSLU1 to GSLU3, lower ground select lines GSLD1 to GSLD3, upper ground erase control lines GIDL_GSU1 to GIDL_GSU3, and lower ground erase control lines GIDL_GSD1 to GIDL_GSD3 and may include the cell strings NS11 to NS33 extending in the vertical direction VD.

For example, the cell string NS11 may include an upper erase control transistor GDTU, a lower erase control transistor GDTD, an upper string select transistor SSTU, a lower string select transistor S_STD, the memory cells MCs, an upper ground select transistor GSTU, a lower ground select transistor GSTD, an upper ground erase control transistor GDT_GSU, and a lower ground erase control transistor GDT_GSD that are connected in series. The upper erase control transistor GDTU may be connected to a corresponding bit line BL1 and a corresponding erase control line GIDL_SSU1, and the lower erase control transistor GDTD may be connected to a corresponding erase control line GIDL_SSD1.

The upper string select transistor SSTU may be connected to a corresponding upper string select line SSLU1, and the lower string select transistor SSTD may be connected to a corresponding lower string select line SSLD1. The upper ground select transistor GSTU may be connected to a corresponding upper ground select line GSLU1, and the lower ground select transistor GSTD may be connected to a corresponding lower ground select line GSLD1. The upper ground erase control transistor GDT_GSU may be connected to a corresponding upper erase control line GIDL__SU1, and the lower ground erase control transistor GDT_GSD may be connected to a corresponding lower erase control line GIDL_GSD1 and the common source line CSL.

Figure 5:
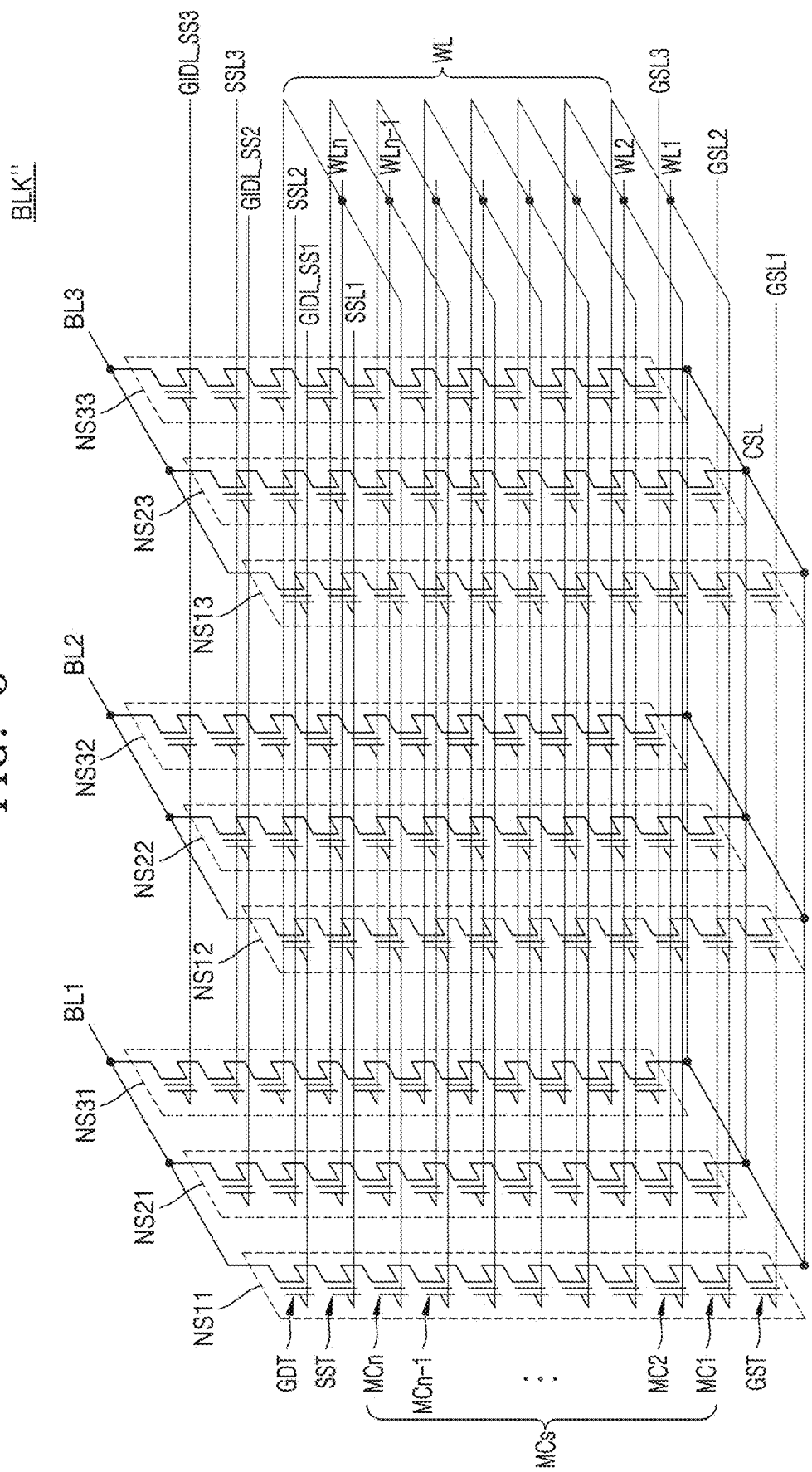

FIG. 5 is a circuit diagram showing a memory block BLK" according to some example embodiments of the inventive concepts.

Referring to FIG. 5, the memory block BLK" may correspond to one of the memory blocks BLK1 to BLKz of FIG. 2. The memory block BLK" corresponds to a modified example of the memory block BLK of FIG. 3, and hereinafter, differences from the memory block BLK of FIG. 3 will be mainly described. The memory block BLK" may be connected to bit lines BL1 to BL3, erase control lines GIDL_SS1 to GIDL_SS3, string select lines SSL1 to SSL3, word lines WL, and ground select lines GSL1 to GSL3 and may include the cell strings NS11 to NS33 extending in the vertical direction VD. Compared to the memory block BLK of FIG. 3, the memory block BLK" may not include a ground erase control line GIDL_GS, and each cell string may not include the ground erase control transistor GDT_GS.

Figure 6A:
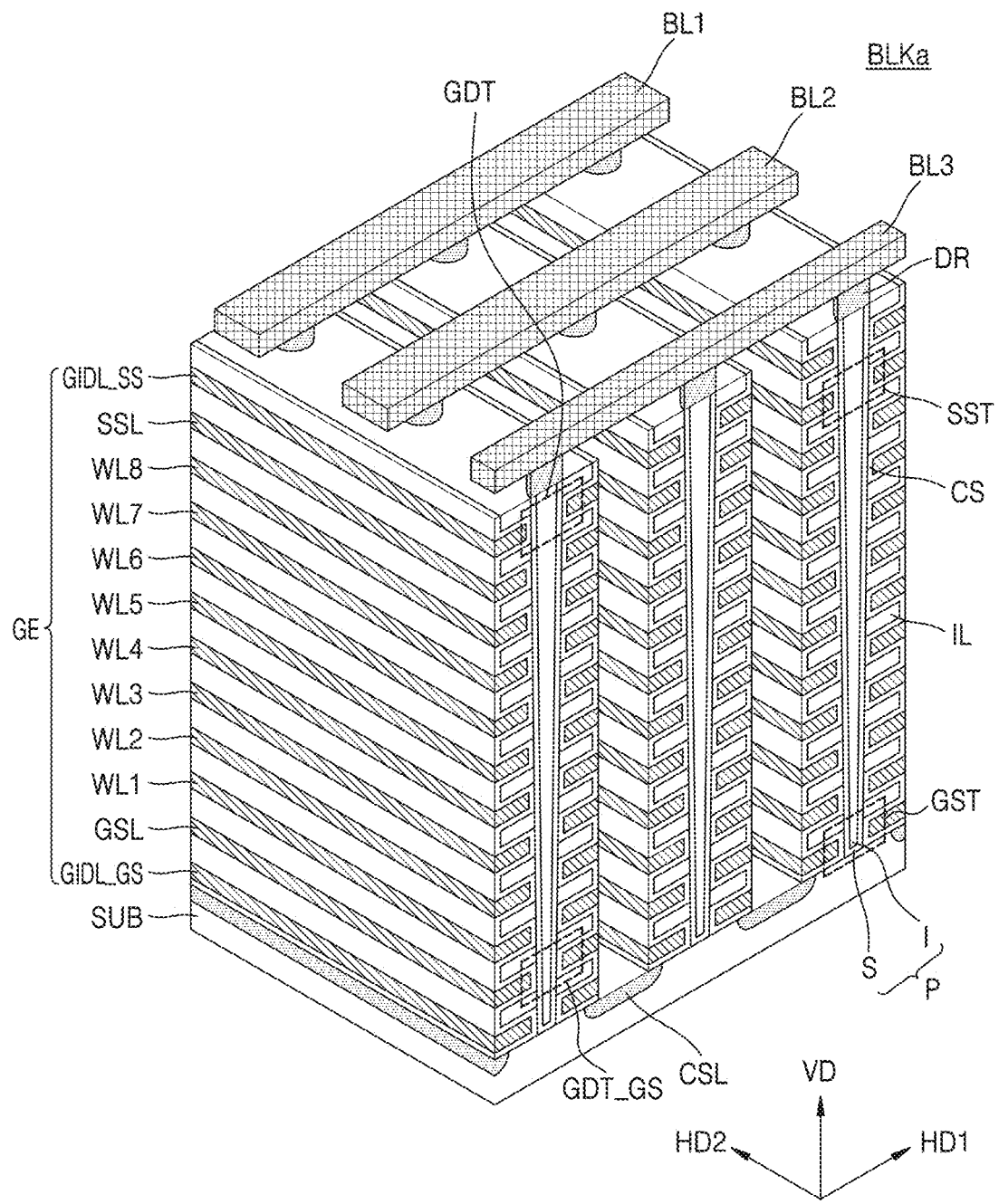
FIGS. 6A and 6B are perspective views of memory blocks according to some example embodiments of the inventive concepts, respectively.

FIG. 6A is a perspective view of a memory block BLKa according to some example embodiments of the inventive concepts.

Referring to FIG. 6A, the memory block BLKa may correspond to one of the memory blocks BLK1 to BLKz of FIG. 2. The memory block BLKa is formed in the vertical direction VD with respect to a substrate SUB. The substrate SUB has a first conductivity type (e.g., p-type) and the common source line CSL extends in the second horizontal direction HD2 on the substrate SUB. In some example embodiments, the common source line CSL doped with impurities of a second conductivity type (e.g., n-type) may be provided to the substrate SUB. In some example embodiments, the substrate SUB may be implemented by using polysilicon, and a plate-type common source line CSL may be disposed on the substrate SUB. On the substrate SUB, a plurality of insulation layers IL extending in the second horizontal direction HD2 are sequentially provided in the vertical direction VD, and the insulation layers IL are spaced apart from one another by a certain distance in the vertical direction VD. For example, the insulation films IL may include an insulating material like silicon oxide.

A plurality of pillars P, which are sequentially arranged in the first horizontal direction RD1 and penetrate through the insulation layers IL in the vertical direction VD, are provided on the substrate SUB. For example, the pillars P will contact the substrate SUB by penetrating through the insulation films IL. In detail, a surface layer S of each pillar P may include a silicon-based material doped with impurities of the first conductivity type and function as a channel region. Therefore, in some example embodiments, a pillar P may be referred to as a channel structure or a vertical channel structure. On the other hand, an internal layer I of each pillar P may include an insulating material like silicon oxide or an air gap.

A charge storage layer CS is provided along exposed surfaces of the insulation layers IL, the pillars P, and the substrate SUB. The charge storage layer CS may include a gate insulation layer (also referred to as a 'tunneling insulation layer'), a charge trapping layer, and a blocking insulation layer. For example, the charge storage layer CS may have an oxide-nitride-oxide (ONO) structure. Also, on an exposed surface of the charge storage layer CS, gate electrodes GE like the ground erase control line GIDL_GS, the ground select line GSL, word lines WL1 to WL8, the string select line SSL, and an erase control line GIDL_SS are provided. The numbers of the ground erase control line GIDL_GS, the ground select line GSL, the word lines WL1 to WL8, the string select line SSL, and the erase control line GIDL_SS may vary according to some example embodiments.

Drain contacts or drains DR are provided on the pillars P, respectively. For example, the drains DR may include a silicon-based material doped with impurities of the second conductivity type. The bit lines BL1 to BL3 extending in a first horizontal direction RD1 and being a certain distance apart from one another in the second horizontal direction HD2 may be provided on the drain contacts DR.

Figure 6B:
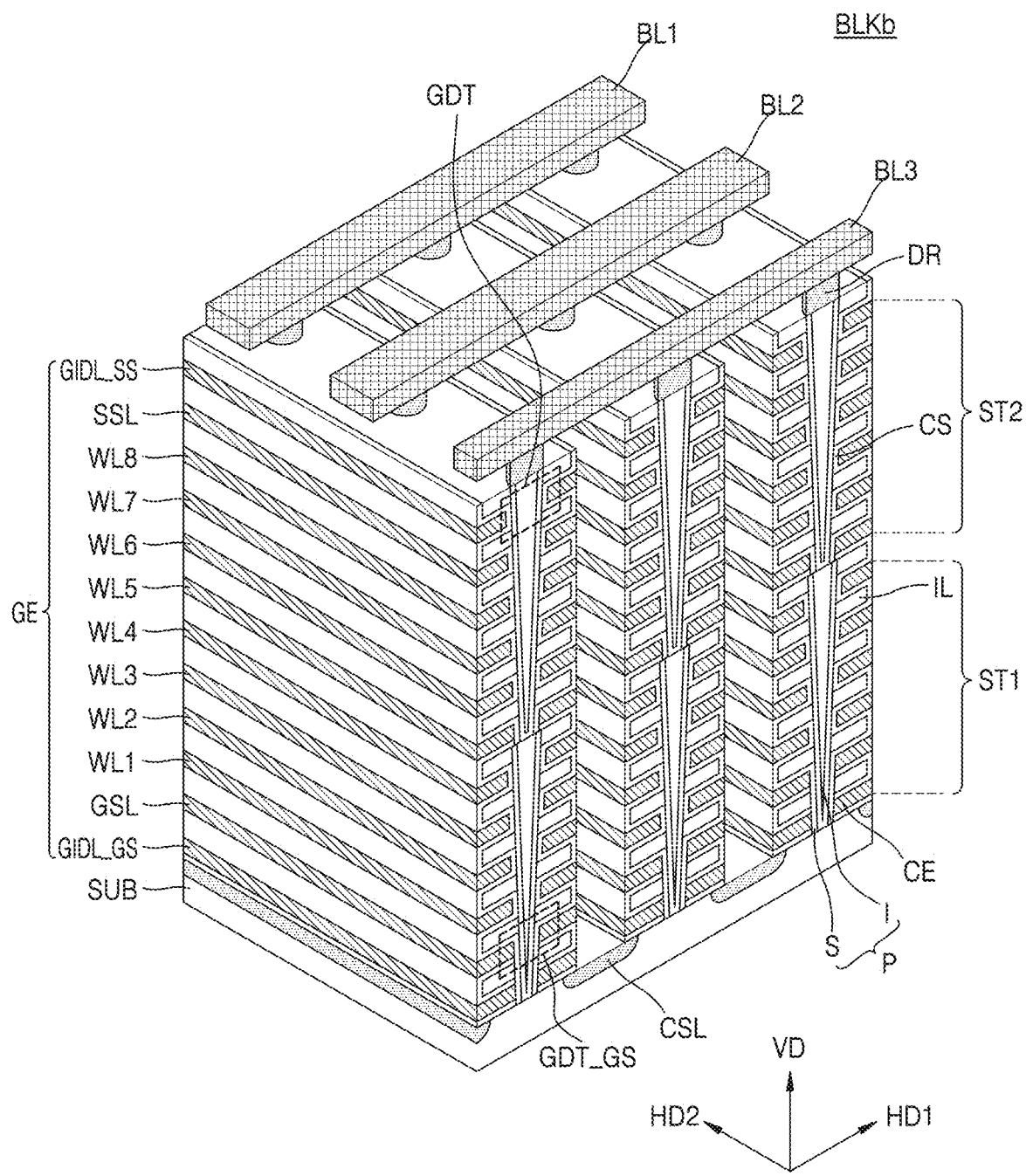

FIG. 6B is a perspective view of a memory block according to some example embodiments of the inventive concepts.

Referring to FIG. 6B, the memory block BLKb may correspond to one of the memory blocks BLK1 to BLKz of FIG. 2. Also, the memory block BLKb corresponds to a modified example of the memory block BLKa of FIG. 6A, and the descriptions given above with reference to FIG. 6A may also be applied to some example embodiments. The memory block BLKb is formed in the vertical direction VD with respect to the substrate SUB. The memory block BLKb may include a first memory stack ST1 and a second memory stack ST2 stacked in the vertical direction VD. However, the inventive concepts are not limited thereto, and the memory block BLKb may include three or more memory stacks.

Figure 7:
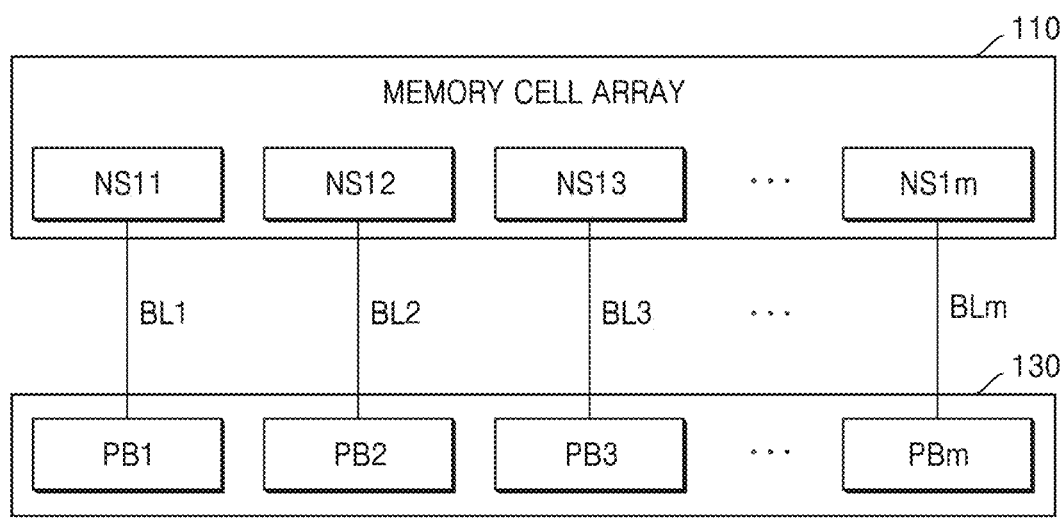
FIG. 7 shows a connection relationship between a memory cell array and a page buffer circuit according to some example embodiments of the inventive concepts.

FIG. 7 shows a connection relationship between the memory cell array 110 and the page buffer circuit 130 according to some example embodiments of the inventive concepts.

Referring to FIG. 7, the memory cell array 110 includes a plurality of cell strings NS11 to NS1m, and the cell strings NS11 to NS1m may each correspond to a vertical cell string extending in a vertical direction with respect to a substrate. The page buffer circuit 130 may include a plurality of page buffers PB1 to PBm. The cell strings NS11 to NS1m may be respectively connected to the page buffers PB1 to PBm through a plurality of bit lines BL1 to BLm. Although FIG. 7 shows the cell strings NS11 to NS1m for convenience of explanation, the memory cell array 110 may, for example, as shown in FIG. 3, further include cell strings NS21, NS31, NS22, NS32, NS23, and NS33, wherein cell strings NS21 and NS31 may be connected to a page buffer PB1 through a bit line BL1, cell strings NS22 and NS32 may be connected to a page buffer PB2 through a bit line BL2, and cell strings NS23 and NS33 may be connected to a page buffer PB3 through a bit line BL3.

Figure 8:
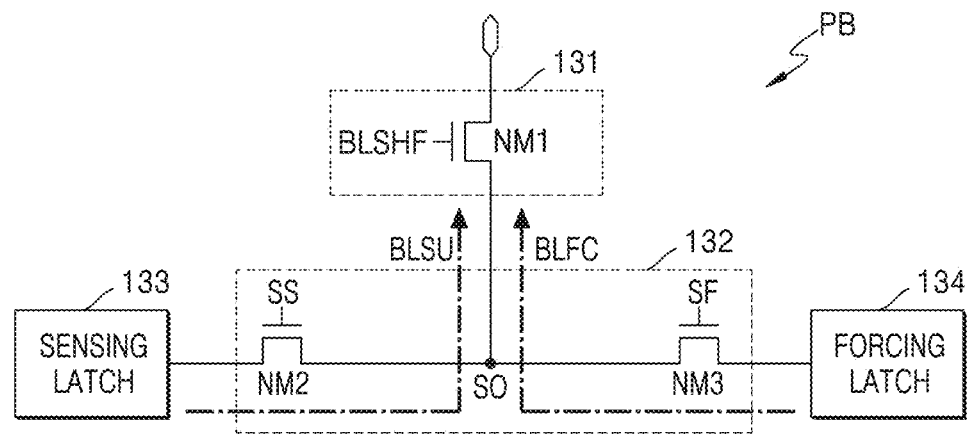
FIG. 8 shows a page buffer according to some example embodiments of the inventive concepts.

FIG. 8 shows a page buffer PB according to some example embodiments of the inventive concepts.

Referring to FIGS. 2 and 8 together, the page buffer PB may correspond to one of the page buffers PB1 to PBm of FIG. 7, and the bit line BL may correspond to one of the bit lines BL1 to BLm of FIG. 7. The page buffer PB may include a bit line selection circuit 131, a switching circuit 132, a sensing latch 133, and a forcing latch 134. However, the inventive concepts are not limited thereto, and the page buffer PB may further include a data latch like an upper bit latch or a lower bit latch, a cache latch, and a pre-charge circuit.

The bit line selection circuit 131 may include a bit line shut-off transistor NM1, which is disposed between the bit line BL and a sensing node SO and is driven by a bit line shut-off signal BLSHF. The control logic circuit 120 may control the bit line shut-off signal BLSHF for each of a program operation, a read operation, and an erase operation, and the voltage generator 140 may provide a voltage corresponding to the bit line shut-off signal BLSHF.

When the bit line shut-off signal BLSHF is at an enable level (e.g., a logic '1'), the bit line shut-off transistor NM1 is turned on, and thus the bit line BL and the page buffer PB may be electrically connected. In other words, the bit line BL and the sensing node SO may be connected. For example, the enable level may correspond to a bit line setup voltage (e.g., V_BS of FIG. 10) or a bit line forcing voltage (e.g., V_BF of FIG. 10). On the other hand, when the bit line shut-off signal BLSHF is at a disable level (e.g., a logic '0'), the bit line shut-off transistor NM1 is turned off, and thus the bit line BL and the page buffer PB may not be electrically connected. In other words, the bit line BL and the sensing node SO may not be connected.

The switching circuit 132 may include a sensing transistor NM2 and a forcing transistor NM3. The sensing transistor NM2 may be disposed between the sensing node SO and the sensing latch 133 and may be driven by the sensing latch selection signal SS. For example, in a bit line setup interval (e.g., 101 of FIG. 10), the control logic circuit 120 may control the sensing latch selection signal SS to an enable level. Therefore, the sensing transistor NM2 may be turned on, and the sensing latch 133 may be electrically connected to the bit line BL through the sensing node SO.

The forcing transistor NM3 may be disposed between the sensing node SO and the forcing latch 134 and may be driven by a forcing latch selection signal SF. For example, in a bit line forcing interval (e.g., 102 of FIG. 10), the control logic circuit 120 may control the forcing latch selection signal SF to an enable level. Therefore, the forcing transistor NM3 may be turned on, and the forcing latch 134 may be electrically connected to the bit line BL through the sensing node SO.

The sensing latch 133 may store bit line setup information BLSU (e.g., Lch1 of FIG. 9) and transfer the bit line setup information BLSU to a selected cell string through the bit line BL in a bit line setup interval. For example, the bit line setup information BLSU may correspond to a program bit line voltage or a program inhibit voltage. As such, the sensing latch 133 may be used to apply a program bit line voltage or a program inhibit voltage to the bit line BL during a program operation. Also, the sensing latch 133 may store data stored in a memory cell or a result of sensing a threshold voltage of a memory cell during a read operation or a program verification operation.

The forcing latch 134 may store bit line forcing information BLFC (e.g., Lch2 of FIG. 9) and transfer the bit line forcing information BLFC to a selected cell string through the bit line BL in a bit line forcing interval. In detail, the bit line forcing information BLFC may correspond to forcing data or force data. The force data may be initially set to '1' and then inverted to '0' when the threshold voltage of a memory cell enters a forcing region that is less than a target region. By using the force data, it is possible to control a bit line voltage during a program execution operation and form a narrower program threshold voltage distribution. As such, the forcing latch 134 may be utilized to improve threshold voltage distribution during a program operation.

Figure 9:
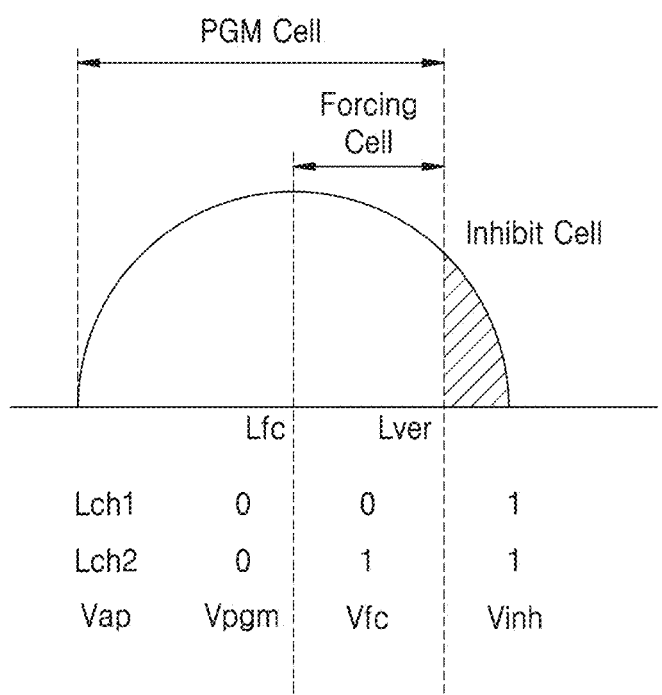
FIG. 9 is a graph showing a threshold voltage distribution of memory cells according to some example embodiments of the inventive concepts.

FIG. 9 is a graph showing a threshold voltage distribution of memory cells according to some example embodiments of the inventive concepts.

Referring to FIGS. 8 and 9, the sensing latch 133 may store first latch information Lch1 corresponding to a verify level Lver. In some example embodiments of the inventive concepts, memory cells having threshold voltages of voltage levels higher than the verify level Lver may be inhibit cells. In this case, the sensing latch 133 may store '1' as the first latch information Lch1. Also, memory cells having threshold voltages of voltage levels lower than the verify level Lver may be program cells. In this case, the sensing latch 133 may store '0' as the first latch information Lch1.

The forcing latch 134 may include second latch information Lch2 corresponding to a forcing level Lfc, as forcing information for a bit line forcing operation. The forcing level Lfc may be a voltage level lower than the verify level Lver. In some example embodiments of the inventive concepts, memory cells having threshold voltages of voltage levels that are higher than the forcing level Lfc and lower than the verify level Lver may be forcing cells. When the voltage level of a threshold voltage is higher than the forcing level Lfc, the forcing latch 134 may store '1' as the second latch information Lch2. Also, for program cells other than forcing cells having threshold voltages of voltage levels lower than the forcing level Lfc, the forcing latch 134 may store '0' as the second latch information Lch2. The page buffer PB may apply different voltages Vap to respective cells by using the first latch information Lch1 and the second latch information Lch2.

The page buffer PB may perform a program operation including a bit line forcing operation by using a two-step verification method. When programming is performed on the program cells at only one voltage level, voltage distribution may be widened. Therefore, based on the forcing level Lfc, the page buffer PB of the inventive concepts may perform a first program operation on cells not to be forced with a bit line program voltage and perform a second program operation on cells to be forced with a bit line forcing voltage V_BF. In detail, the page buffer PB may apply the bit line forcing voltage V_BF, which is higher than a bit line program voltage and lower than a bit line inhibit voltage, to cells to be forced to perform a bit line forcing operation.

In some example embodiments, the bit line program voltage may be a ground voltage GND, the bit line inhibit voltage may be a power voltage VDD, and the bit line forcing voltage V_BF may have a voltage level between that of the power voltage VDD and that of the ground voltage GND. Therefore, the page buffer PB may distinguish inhibit target cells, forcing cells, and program cells not to be forced based on the first latch information Lch1 and the second latch information Lch2. In detail, the page buffer PB may distinguish program cells and an inhibit cells by using the first latch information Lch1 in a bit line setup operation and distinguish cells to be forced and program cells not to be forced by using the second latch information Lch2 in a bit line forcing operation.

Therefore, the page buffer PB may apply a bit line inhibit voltage to cells to be inhibited, apply the bit line forcing voltage V_BF to cells to be forced, and apply a bit line program voltage to program cells not to be forced. Therefore, the first latch information Lch1 may be referred to as "bit line setup information" and the second latch information Lch2 may be referred to as "bit line forcing information".

FIG. 10 is a timing diagram showing a program operation of a memory device according to some example embodiments of the inventive concepts.

Referring to FIGS. 8 and 10 together, a bit line setup interval 101 is an interval from t0 to t1 and may be defined as an interval in which the bit line shut-off voltage V_BLSHF corresponding to the bit line shut-off signal BLSHF maintains a voltage level corresponding to a bit line setup voltage V_BS. In the bit line setup interval 101, an erase control voltage V_GIDL_SS applied to an erase control line GILD SS may rise to a bias voltage VBIAS, and the string select line voltage V_SSL applied to the string select line SSL may rise to a fourth voltage V4.

In a program execution interval 102, a selected word line voltage V_WLsel applied to a selected word line may correspond to a program voltage VPGM, and an unselected word line voltage V_WLunsel applied to an unselected word line may correspond to a pass voltage VPASS. The program execution interval 102 may be divided into a first interval INT1 from t1 to t2, a second interval INT2 from t2 to t3, and a third interval INT3 from t3 to t4.

The second interval INT2 may be defined as an interval in which the bit line shut-off voltage V_BLSHF maintains a voltage level corresponding to the bit line forcing voltage V_BF and may be referred to as a "bit line forcing interval". In the second interval INT2, a voltage applied to the bit line BL may be varied according to a value stored in the forcing latch 134 (e.g., forcing information), during program execution. The first interval INT1 may correspond to an interval before a bit line forcing interval of the program execution interval 102, and the third interval INT3 may correspond to an interval after the bit line forcing interval of the program execution interval 102.

In some example embodiments, in the program execution interval 102, the string select line voltage V_SSL may be controlled for each of first to third intervals INT1, INT2, and INT3. For example, the string select line voltage V_SSL may be controlled to the first voltage V1 in the first interval INT1, the string select line voltage V_SSL may be controlled to the second voltage V2 in the second interval INT2, and the string select line voltage V_SSL may be controlled to the third voltage V3 in the third interval INT3. In this case, at least two of first to third voltages V1, V2, and V3 may have different voltage levels.

As such, the bit line setup interval 101 and the program execution interval 102 shown in FIG. 10 may correspond to an N-th loop of a program operation, where N is a positive integer equal to or greater than 2. In detail, since forcing information may be stored in the forcing latch 134 according to a result of a first loop of a program operation, the bit line setup interval 101 and the program execution interval 102 may respond to a second loop or later loops. Although not shown, the program execution interval 102 may be followed by a program verify interval.

Figure 11A:
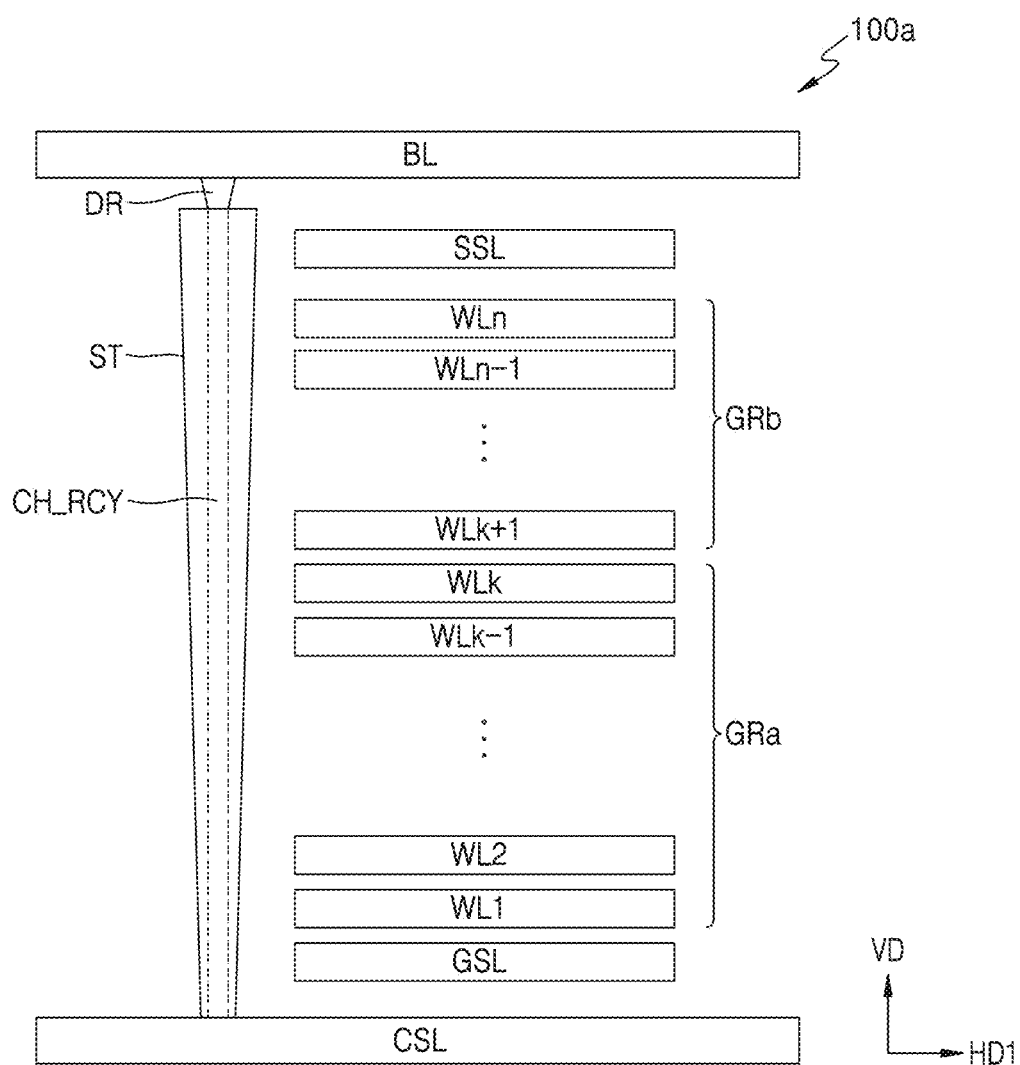
FIG. 11A is a schematic view of a memory device according to some example embodiments of the inventive concepts.

FIG. 11A is a diagram schematically showing a memory device 100a according to some example embodiments of the inventive concepts.

Referring to FIG. 11A, the memory device 100a may include the common source line CSL and the bit line BL extending in the first horizontal direction RD1 and may include a memory stack ST extending in the vertical direction VD. In this case, the stack ST may be connected to the bit line BL through a drain DR. For example, the memory device 100a may correspond to the example of FIG. 6A, wherein the memory stack ST may correspond to the pillar P of FIG. 6A and may also correspond to a first cell string NS11 of FIG. 3.

The memory device 100a may further include the word lines WL1 to WLn stacked in the vertical direction VD, the ground select line GSL may be disposed between the common source line CSL and a word line WL1, and the string select line SSL may be disposed between the bit line BL and a word line WLn. Although not shown, an erase control line (e.g., GIDL_SS of FIG. 6A) may be further disposed between the string select line SSL and the bit line BL, and an erase control line (e.g., GIDL_GS of FIG. 6A) may be further disposed between the ground select line GSL and the common source line CSL.

In some example embodiments, the word lines WL1 to WLn may be grouped into a plurality of groups including a first group GRa and a second group GRb. The first group GRa may include word lines (e.g., WL1 to WLk) relatively close to a substrate and the second group GRb may include word lines (e.g., WLk+1 to WLn) relatively far from the substrate, wherein k is a positive integer between 1 and n. According to some example embodiments, the word lines WL1 to WLn may be grouped into three or more groups.

FIG. 11B is a table showing voltages applied to a string select line according to selected word lines during a program operation of the memory device 100a of FIG. 10A according to some example embodiments of the inventive concepts.

Referring to FIGS. 11A and 11B together, in a bit line setup interval BLSETUP, when a selected word line corresponds to one of the word lines WL1 to WLk of the first group GRa, a fourth voltage V4a may be applied to the string select line. Meanwhile, in the bit line setup interval BLSETUP, when the selected word line corresponds to one of the word lines WLk+1 to WLn of the second group GRb, a fourth voltage V4b may be applied to the string select line.

In a program execution interval PGMEXE, when the selected word line corresponds to one of the word lines WL1 to WLk of the first group GRa, a first voltage V1a may be applied to the string select line in the first interval INT1, a second voltage V2a may be applied to the string select line in the second interval INT2, and a third voltage V3a may be applied to the string select line in the third interval INT3. Meanwhile, in the program execution interval PGMEXE, when the selected word line corresponds to one of the word lines WLk+1 to WLn of the second group GRb, a first voltage V1b may be applied to the string select line in the first interval INT1, a second voltage V2b may be applied to the string select line in the second interval INT2, and a third voltage V3b may be applied to the string select line in the third interval INT3.

Figure 12A:
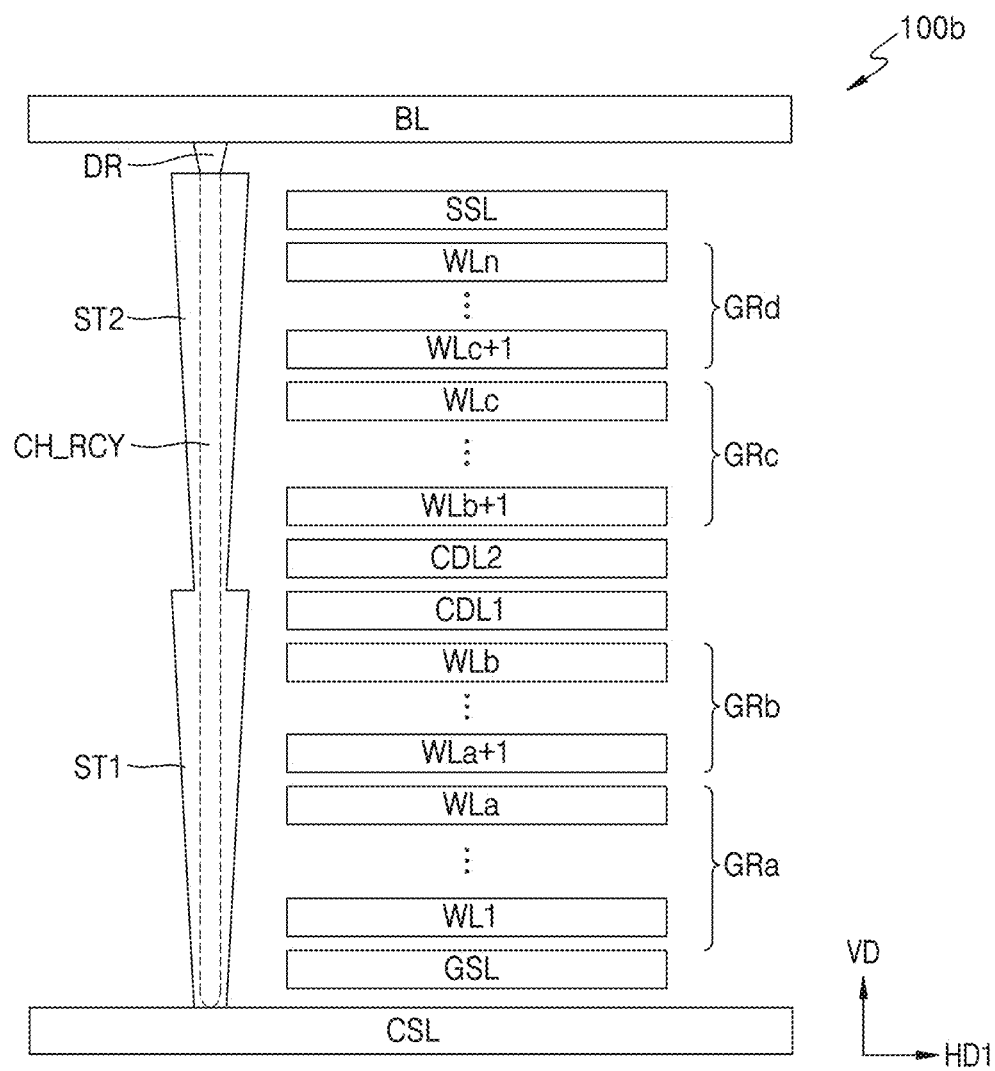
FIG. 12A is a schematic view of a memory device according to some example embodiments of the inventive concepts.

FIG. 12A is a diagram schematically showing a memory device 100b according to some example embodiments of the inventive concepts.

Referring to FIG. 12A, the memory device 100b may include the common source line CSL and the bit line BL extending in the first horizontal direction HD1 and may include the first memory stack ST1 and the second memory stack ST2 extending in the vertical direction VD. In this case, the first memory stack ST1 is disposed on the common source line CSL, and the second memory stack ST2 is disposed on the first memory stack ST1 and may be connected to the bit line BL through the drain DR. For example, the memory device 100b may corresponds to the example of FIG. 6B, and the first memory stack ST1 and the second memory stack ST2 may correspond to the first memory stack ST1 and the second memory stack ST2 of FIG. 6B, respectively.

The memory device 100b may further include the word lines WL1 to WLn stacked in the vertical direction VD, the ground select line GSL may be disposed between the common source line CSL and a word line WL1, and the string select line SSL may be disposed between the bit line BL and a word line WLn. Also, the memory device 100b may further include first and second junction dummy word lines CDL1 and CDL2 corresponding to the junction of the first memory stack ST1 and the second memory stack ST2. However, the inventive concepts are not limited thereto, and the number of junction dummy word lines corresponding to the junction may vary according to some example embodiments. Also, according to some example embodiments, no junction dummy word line may be provided.

In some example embodiments, the word lines WL1 to WLn may be grouped into a plurality of groups including the first group GRa, the second group GRb, a third group GRc, and a fourth group GRd. The first group GRa and the second group GRb may include word lines connected to the first memory stack ST1, and the third group GRc and the fourth group GRd may include word lines connected to the second memory stack ST2. The first group GRa may include word lines (e.g., WL1 to WLa) relatively close to a substrate, and the second group GRb may include word lines (e.g., WLa+1 to WLb) farther from the substrate as compared to the word lines of the first group GRa. Here, a and b are positive integers between 1 and n, and a is smaller than b. The third group GRc may include word lines (e.g., WLb+1 to WLc) farther from the substrate as compared to the word lines of the second group GRb, and the fourth group GRd may include word lines (e.g., WLc+1 to WLn) farther from the substrate as compared to the word lines of the third group GRc, where c is a positive integer between b and n. According to some example embodiments, the word lines WL1 to WLn may be grouped into five or more groups.

In some example embodiments, the memory device may include three or more memory stacks, and, as the number of memory stacks increases, the number of groups corresponding to a plurality of word lines may also increase. For example, when the memory device includes three memory stacks, a plurality of word lines may be grouped into six groups, but the inventive concepts are not limited thereto.

FIG. 12B is a table showing voltages applied to a string select line according to selected word lines during a program operation of the memory device 100b of FIG. 12A according to some example embodiments of the inventive concepts.

Referring to FIGS. 12A and 12B together, in a bit line setup interval BLSETUP, when a selected word line corresponds to one of the word lines WL1 to WLa of the first group GRa, the fourth voltage V4a may be applied to the string select line. Meanwhile, in the bit line setup interval BLSETUP, when the selected word line corresponds to one of the word lines WLa+1 to WLb of the second group GRb, the fourth voltage V4b may be applied to the string select line. In the bit line setup interval BLSETUP, when the selected word line corresponds to one of the word lines WLb+1 to WLc of the third group GRc, a fourth voltage V4c may be applied to the string select line. In the bit line setup interval BLSETUP, when the selected word line corresponds to one of the word lines WLc+1 to WLn of the fourth group GRd, a fourth voltage V4d may be applied to the string select line.

In a program execution interval PGMEXE, when the selected word line corresponds to one of the word lines WL1 to WLa of the first group GRa, a first voltage V1a may be applied to the string select line in the first interval INT1, a second voltage V2a may be applied to the string select line in the second interval INT2, and a third voltage V3a may be applied to the string select line in the third interval INT3. In the program execution interval PGMEXE, when the selected word line corresponds to one of the word lines WLa+1 to WLb of the second group GRb, a first voltage V1b may be applied to the string select line in the first interval INT1, a second voltage V2b may be applied to the string select line in the second interval INT2, and a third voltage V3b may be applied to the string select line in the third interval INT3. In the program execution interval PGMEXE, when the selected word line corresponds to one of the word lines WLb+1 to WLc of the third group GRc, a first voltage V1c may be applied to the string select line in the first interval INT1, a second voltage V2c may be applied to the string select line in the second interval INT2, and a third voltage V3c may be applied to the string select line in the third interval INT3. In the program execution interval PGMEXE, when the selected word line corresponds to one of the word lines WLc+1 to WLn of the fourth group GRd, a first voltage V1d may be applied to the string select line in the first interval INT1, a second voltage V2d may be applied to the string select line in the second interval INT2, and a third voltage V3d may be applied to the string select line in the third interval INT3.

Figure 13A:
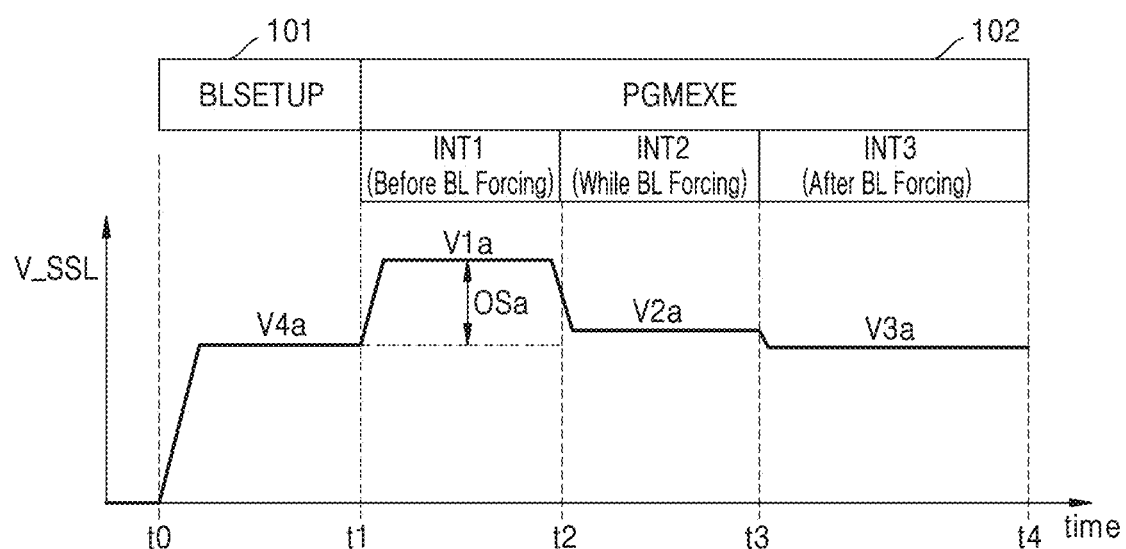
FIG. 13A is a timing diagram showing a voltage applied to a string select line during a program operation for a first group according to some example embodiments of the inventive concepts.

FIG. 13A is a timing diagram showing a voltage applied to a string select line during a program operation for the first group GRa according to some example embodiments of the inventive concepts.

Referring to FIG. 13A, when a selected word line corresponds to one of word lines of the first group GRa, the string select line voltage V_SSL may be controlled to the first voltage V1a having a voltage level higher than that of the fourth voltage V4a in the first interval INT1 before a bit line forcing operation. In this case, the voltage level of the first voltage V1a may be higher than the voltage level of the fourth voltage V4a by a first offset OSa. Therefore, initial channel recovery may be efficiently performed.

In particular, during a program operation on a bottom word line, by setting the voltage level of the first voltage V1a to be relatively high, initial channel recovery may be smoothly performed. For example, in top to bottom (T2B) programming in which the program sequence is in the direction from the string select line SSL to the ground select line GSL, programming of memory cells connected to the top word line is already completed, the first voltage V1a may be set to be relatively high during a program operation on memory cells connected to the bottom word line. For example, in bottom to top (B2T) programming in which the program sequence is a direction from the ground select line GSL to the string select line SSL, a channel region corresponding to the bottom word line is relatively far from a bit line. Therefore, the voltage level of the first voltage V1a may be set to be relatively high, thereby facilitating initial channel recovery.

During the second interval INT2 in which the bit line forcing operation is performed, the string select line voltage V_SSL may be controlled to the second voltage V2a. For example, the voltage level of the second voltage V2a may correspond to a voltage level between the voltage level of the first voltage V1 a and the voltage level of the third voltage V3a, but the inventive concepts are not limited thereto. During the third interval INT3 after the bit line forcing operation, the string select line voltage V_SSL may be controlled to the third voltage V3a. For example, the voltage level of the third voltage V3a may be lower than the voltage level of the first voltage V1a and the voltage level of the second voltage V2a, but the inventive concepts are not limited thereto. For example, the voltage level of the third voltage V3a may be the same as the voltage level of the fourth voltage V4a, but the inventive concepts are not limited thereto.

Figure 13B:
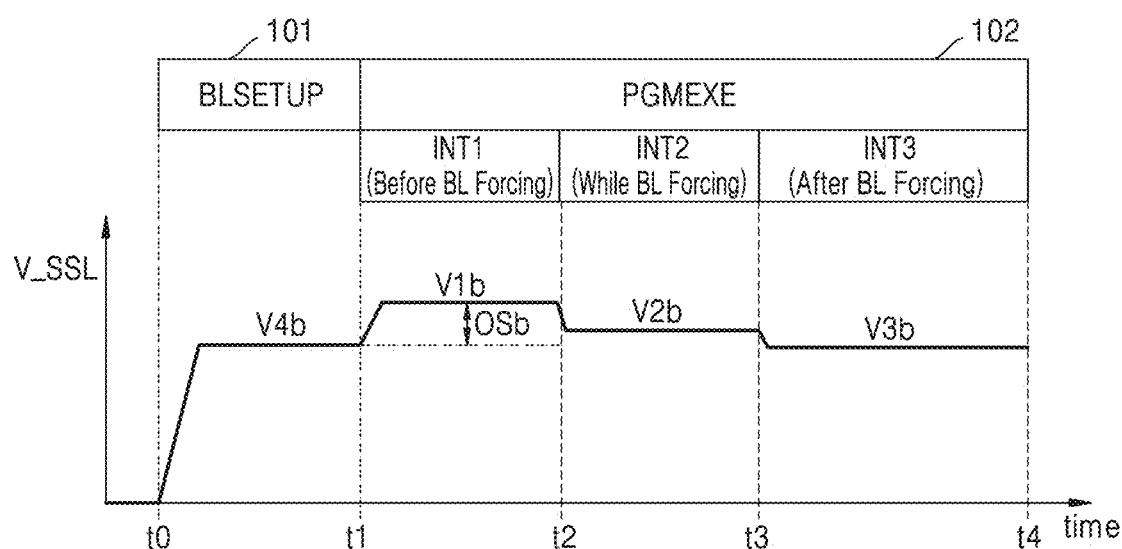
FIG. 13B is a timing diagram showing a voltage applied to a string select line during a program operation for a second group according to some example embodiments of the inventive concepts.

FIG. 13B is a timing diagram showing a voltage applied to a string select line during a program operation for the second group GRb according to some example embodiments of the inventive concepts.

Referring to FIG. 13B, when a selected word line corresponds to one of word lines of the second group GRb, the string select line voltage V_SSL may be controlled to the first voltage V1b having a voltage level higher than that of the fourth voltage V4b in the first interval INT1 before a bit line forcing operation. In this case, the voltage level of the first voltage V1b may be higher than the voltage level of the fourth voltage V4b by a second offset OSb. In this case, the second offset OSb may be smaller than the first offset OSa.

During the second interval INT2 in which the bit line forcing operation is performed, the string select line voltage V_SSL may be controlled to the second voltage V2b. For example, the voltage level of the second voltage V2b may correspond to a voltage level between the voltage level of the first voltage V1b and the voltage level of the third voltage V3b, but the inventive concepts are not limited thereto. During the third interval INT3 after the bit line forcing operation, the string select line voltage V_SSL may be controlled to the third voltage V3b. For example, the voltage level of the third voltage V3b may be lower than the voltage level of the first voltage V1b and the voltage level of the second voltage V2b, but the inventive concepts are not limited thereto. For example, the voltage level of the third voltage V3b may be the same as the voltage level of the fourth voltage V4b, but the inventive concepts are not limited thereto.

Figure 14:
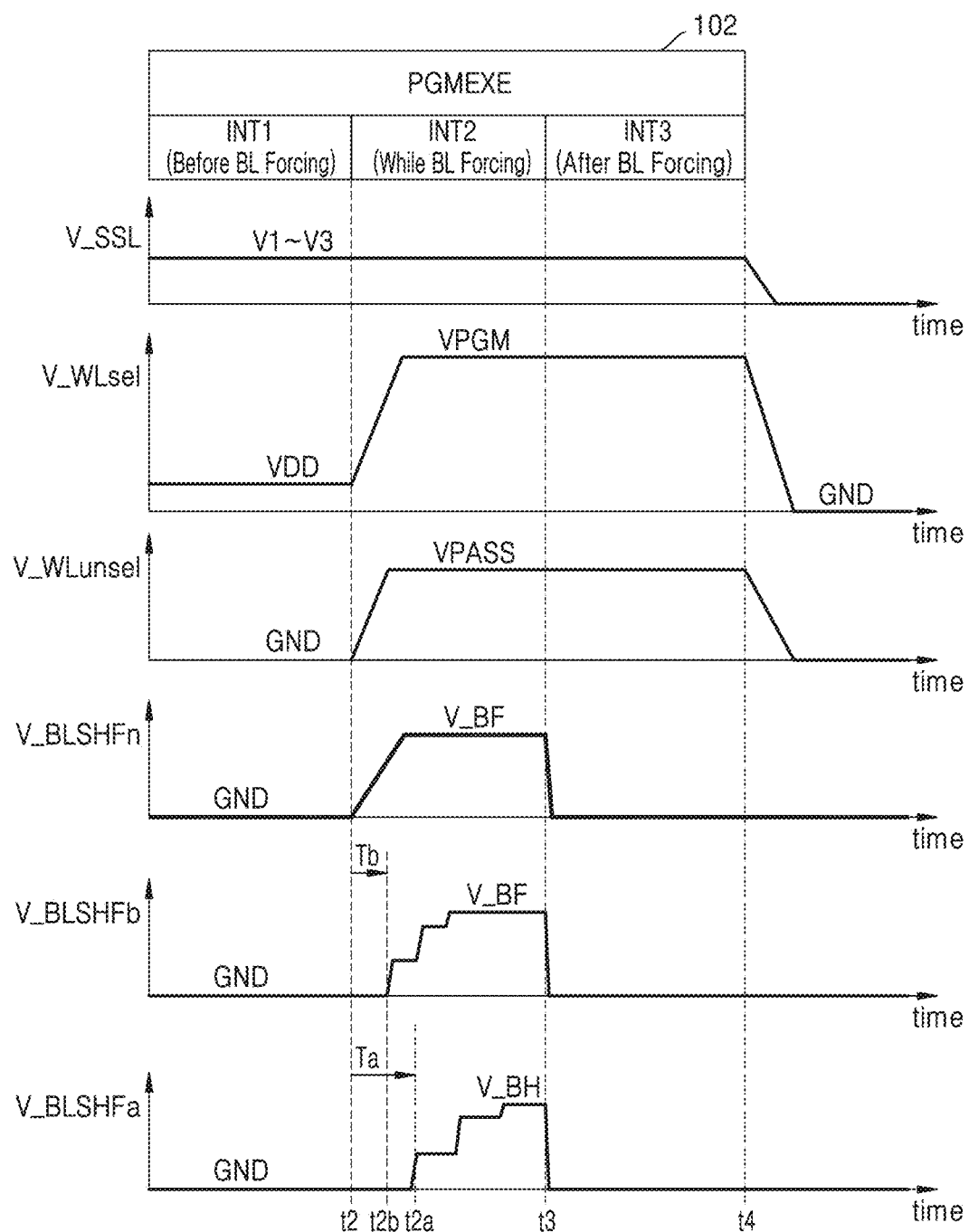
FIG. 14 is a timing diagram showing a program operation for a memory device according to some example embodiments of the inventive concepts.

FIG. 14 is a timing diagram showing a program operation for a memory device according to some example embodiments of the inventive concepts.

Referring to FIG. 14, the program execution interval 102 may be divided into first to third intervals INT1, INT2, and INT3, the program execution interval 102 may correspond to an interval after a bit line setup interval (e.g., FIG. 101 of 10), and the program execution interval 102 may be followed by a program verify interval. Also, the program execution interval 102 may be included in an N-th loop during a program operation of the memory device, where N is a positive integer greater than 2.

The string select line voltage V_SSL may be controlled for each of the first to third intervals INT1, INT2, and INT3. For example, the string select line voltage V_SSL may be controlled to the first voltage V1 in the first interval INT1, may be controlled to the second voltage V2 in the second interval INT2, and may be controlled to the third voltage V3 in the third interval INT3. According to some example embodiments, at least two of first to third voltages V1 to V3 may have different voltage levels. However, the inventive concepts are not limited thereto, and, in some example embodiments, all of the first to third voltages V1 to V3 may have the same voltage level. Also, the control logic circuit 120 may not individually control the string select line voltage V_SSL for each of the first to third intervals INT1, INT2, and INT3.

The selected word line voltage V_WLsel applied to a selected word line may rise to the program voltage VPGM in the program execution interval 102. For example, the selected word line voltage V_WLsel may rise from the power voltage VDD to the program voltage VPGM at t2 and may fall from the program voltage VPGM to the ground voltage GND at t4. However, the inventive concepts are not limited thereto, and the timing at which the selected word line voltage V_WLsel rises to the program voltage VPGM may vary according to example embodiments.

The unselected word line voltage V_WLunsel applied to an unselected word line may rise from the ground voltage GND to the pass voltage VPASS in the program execution interval 102. For example, the unselected word line voltage V_WLunsel may rise from the ground voltage GND to the pass voltage VPASS at t2 and may fall from the pass voltage VPASS to the ground voltage GND at t4. However, the inventive concepts are not limited thereto, and the timing at which the unselected word line voltage V_WLunsel rises to the pass voltage VPASS may vary according to example embodiments.

According to some example embodiments, the waveform of a bit line shut-off voltage corresponding to the bit line shut-off signal BLSHF may be controlled according to the position of a selected word line on which a program operation is performed. For example, when the selected word line is a normal word line, the second interval INT2 in which a bit line forcing operation is performed may correspond to an interval from t2 to t3. Here, the bit line shut-off voltage V_BLSHFn may be the ground voltage GND in the first interval INT1, may maintain a voltage level corresponding to a bit line forcing voltage V_FC in the second interval INT2, and may fall back to the ground voltage GND. Here, the normal word line may be referred to as a reference word line.

When the selected word line corresponds to one of the word lines WL1 to WLk of a first group (e.g., GRa of FIG. 11A), a delay interval in which a bit line shut-off voltage V_BLSHFa maintains a voltage level corresponding to the ground voltage GND before a bit line forcing operation may be increased by a first delay Ta as compared to a bit line shut-off voltage V_BLSHFn. Therefore, as compared to the bit line shut-off voltage V_BLSHFn, the first interval INT1 for the bit line shut-off voltage V_BLSHFa may increase to t2a, and the second interval INT2 may be reduced from t2a to t3.

Meanwhile, when the selected word line corresponds to one of the word lines WLk+1 to WLn of a second group (e.g., GRb of FIG. 11A), a delay interval in which a bit line shut-off voltage V_BLSHFb maintains a voltage level corresponding to the ground voltage GND before a bit line forcing operation may be increased by a second delay Tb as compared to the bit line shut-off voltage V_BLSHFn. Therefore, as compared to the bit line shut-off voltage V_BLSHFn, the first interval INT1 for the bit line shut-off voltage V_BLSHFb may increase to t2b, and the second interval INT2 may be reduced from t2b to t3.

Figure 15A:
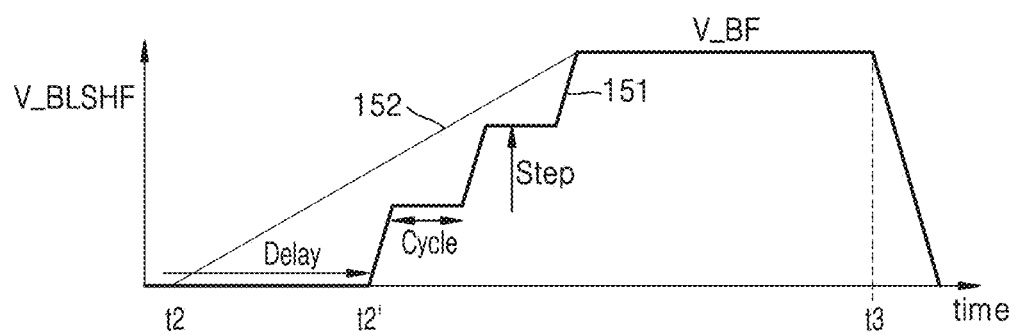
FIG. 15A shows a voltage waveform of a bit line shut-off signal during a program operation for a memory device according to some example embodiments of the inventive concepts.

FIG. 15A shows a voltage waveform of a bit line shut-off signal during a program operation of a memory device according to some example embodiments of the inventive concepts.

Referring to FIGS. 2 and 15A together, the horizontal axis represents time and the vertical axis represents the bit line shut-off voltage V_BLSHF. A bit line shut-off voltage 151 represents a voltage waveform controlled for a bit line forcing operation according to some example embodiments and, for example, may correspond to the bit line shut-off voltage V_BLSHFa or the bit line shut-off voltage V_BLSHFb of FIG. 14. A bit line shut-off voltage 152 represents a voltage waveform controlled for a bit line forcing operation according to a comparative example and, for example, may correspond to the bit line shut-off voltage V_BLSHFn of FIG. 14.

The bit line shut-off voltage 152 may be generated as a ramp waveform having a certain slope and may rise from the ground voltage to the bit line forcing voltage V_BF. On the contrary, the bit line shut-off voltage 151 may be generated as a step waveform having a plurality of steps and may rise from the ground voltage to the bit line forcing voltage V_BF. The control logic circuit 120 may control the voltage level of a bit line shut-off signal (e.g., the bit line shut-off voltage 151) to a step waveform before a bit line forcing operation for transferring forcing information to a selected cell string through a bit line is performed during a program operation on a selected word line.

In some example embodiments, when during a program operation on the selected word line, the control logic circuit 120 may control a delay interval in which the voltage level of a bit line shut-off voltage (e.g., the bit line shut-off voltage 151) maintains a voltage level corresponding to the ground voltage, before a bit line forcing operation is performed. The control logic circuit 120 may delay a start time of application of the bit line forcing voltage V_BF from t2 to t2' by a certain delay. In this case, the control logic circuit 120 may differently control the delay according to the position of the selected word line.

In some example embodiments, the control logic circuit 120 may control a maintenance interval (e.g., a cycle) of each of a plurality of steps for performing a bit line forcing operation. In this case, the control logic circuit 120 may differently control the cycle according to the position of the selected word line. In some example embodiments, the control logic circuit 120 may control a rising voltage (e.g., a step) of each of a plurality of steps for performing a bit line forcing operation. In this case, the control logic circuit 120 may differently control the step according to the position of the selected word line. In some example embodiments, the control logic circuit 120 may control the number of a plurality of steps for performing a bit line forcing operation. In this case, the control logic circuit 120 may differently control the number of the steps according to the position of the selected word line.

FIG. 15B shows an operation of controlling a bit line shut-off signal according to a selected word line during a program operation of a memory device according to some example embodiments of the inventive concepts.

Referring to FIGS. 2, 15A, and 15B together, in a program execution interval, when a selected word line corresponds to one of the word lines WL1 to WLk of the first group GRa, the bit line shut-off voltage V_BLSHF corresponding to the bit line shut-off signal BLSHF may be generated to have the first delay Ta, a first step Va, and a first cycle T'a. Meanwhile, in the program execution interval, when the selected word line corresponds to one of the word lines WLk+1 to WLn of the second group GRb, the bit line shut-off voltage V_BLSHF corresponding to the bit line shut-off signal BLSHF may be generated to have the second delay Tb, a second step Vb, and a second cycle T'b.

In some example embodiments, the first delay Ta may be longer than the second delay Tb, and thus a time point for applying the bit line shut-off voltage V_BLSHF for a bit line forcing operation during a program operation on a bottom word line may be later than a time point for applying the bit line shut-off voltage V_BLSHF for a bit line forcing operation during a program operation on a top word line.

In some example embodiments, the first step Va may be greater than the second step Vb, and thus each step of a step waveform corresponding to the bit line shut-off voltage V_BLSHF for the bit line forcing operation during the program operation on the bottom word line may be greater than each step of a step waveform corresponding to the bit line shut-off voltage V_BLSHF for the bit line forcing operation during the program operation on the top word line. In some example embodiments, the first cycle T'a may be shorter than the second cycle T'b, and thus a time for maintaining each step of the step waveform corresponding to the bit line shut-off voltage V_BLSHF for the bit line forcing operation during the program operation on the bottom word line may be shorter than a time for maintaining each step of the step waveform corresponding to the bit line shut-off voltage V_BLSHF for the bit line forcing operation during the program operation on the bottom word line.

In some example embodiments, the word lines WL1 to WLn may be grouped into three or more groups, and the control logic circuit 120 may individually control a delay, a step, and a cycle of the bit line shut-off voltage V_BLSHF for each of the three or more groups. For example, at least one of the delay, the step, and the cycle of the bit line shut-off voltage V_BLSHF may be different for each of the three or more groups.

In some example embodiments, the memory device may include a plurality of memory stacks, for example, as shown in FIG. 6B or FIG. 12A. The control logic circuit 120 may group word lines corresponding to each memory stack into two or more groups and may control at least one of the delay, the step, and the cycle of the bit line shut-off voltage V_BLSHF for different groups.

Figure 16:
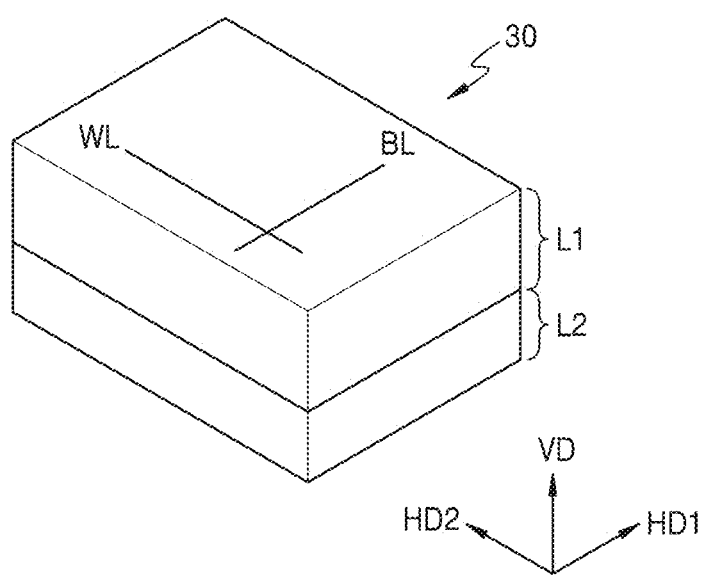
FIG. 16 shows a memory device having a cell over peri (COP) structure, according to some example embodiments of the inventive concepts.

FIG. 16 shows a memory device 30 having a cell over peri (COP) structure, according to some example embodiments of the inventive concepts.

Referring to FIGS. 2 and 16 together, the memory device 30 may include a first semiconductor layer L1 and a second semiconductor layer L2, and the first semiconductor layer L1 may be stacked in the vertical direction VD with respect to the second semiconductor layer L2. In detail, the second semiconductor layer L2 may be disposed below the first semiconductor layer L1 in the vertical direction VD. The memory device 100 of FIG. 1 may have a COP structure like the memory device 30.

In some example embodiments, the memory cell array 110 may be formed on the first semiconductor layer L1, whereas the control logic circuit 120, the page buffer circuit 130, the voltage generator 140, and the row decoder 150 may be formed on the second semiconductor layer L2. Therefore, the memory device 30 may have a structure in which the memory cell array 110 is disposed over some peripheral circuits, that is, the COP structure. The COP structure can effectively reduce a horizontal area and improve the degree of integration of the memory device 30.

In some example embodiments, the second semiconductor layer L2 may include a substrate, and circuits may be formed on the second semiconductor layer L2 by forming semiconductor devices like transistors and patterns for distributing devices on the substrate. After circuits are formed on the second semiconductor layer L2, the first semiconductor layer L1 including the memory cell array 110 may be formed, and patterns for electrically connecting the word lines WL and bit lines BL of the memory cell array 110 to the circuits formed on the second semiconductor layer L2 may be formed.

Figure 17:
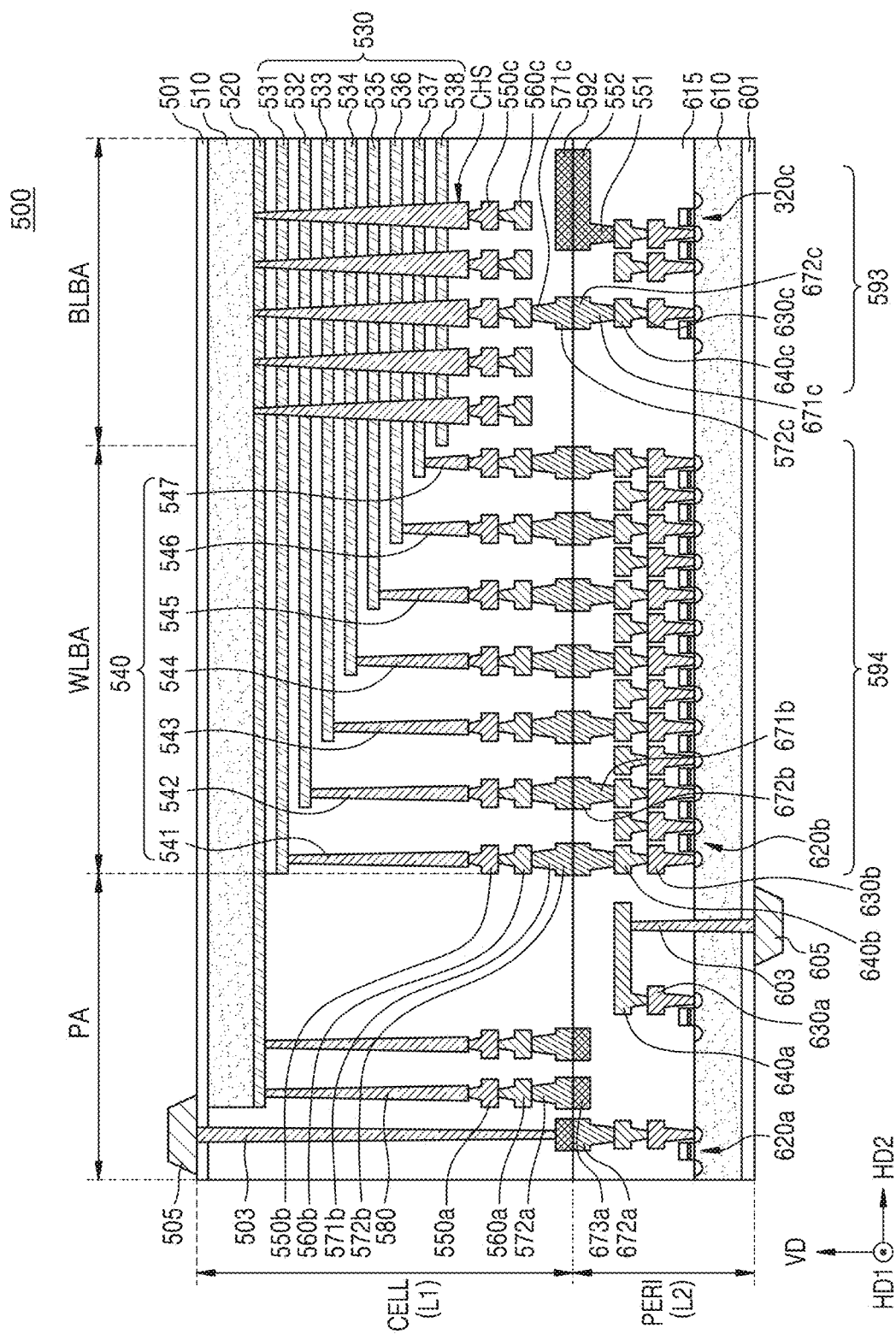
FIG. 17 is a cross-sectional view of a memory device having a bonding vertical NAND (B-VNAND) structure, according to some example embodiments of the inventive concepts.

FIG. 17 is a cross-sectional view of a memory device 500 having a bonding vertical NAND (B-VNAND) structure, according to some example embodiments of the inventive concepts. When a non-volatile memory included in a memory device is implemented as a B-VNAND type flash memory, the non-volatile memory may have the structure shown in FIG. 17.

Referring to FIG. 17, a cell region CELL of a memory device 500 may correspond to a first semiconductor layer L1, and a peripheral circuit region PERI may correspond to a second semiconductor layer L2. The peripheral circuit region PERI and the cell region CELL of the memory device 500 may each include an external pad bonding area PA, a word line bonding area WLBA, and a bit line bonding area BLBA. For example, the word lines WL, the string select lines SSL, the ground select lines GSL, and the memory cell array 110 of FIG. 2 may be formed on the first semiconductor layer L1, whereas the control logic circuit 120, the page buffer circuit 130, the voltage generator 140, and the row decoder 150 may be formed on the second semiconductor layer L2.

The peripheral circuit region PERI may include a first substrate 610, an interlayer insulating layer 615, a plurality of circuit elements 620*a*, 620*b*, and 620*c* formed on the first substrate 610, first metal layers 630*a*, 630*b*, and 630*c* respectively connected to the plurality of circuit elements 620*a*, 620*b*, and 620*c*, and second metal layers 640*a*, 640*b*, and 640*c* formed on the first metal layers 630*a*, 630*b*, and 630*c*. In some example embodiments, the first metal layers 630*a*, 630*b*, and 630*c* may be formed of tungsten having relatively high resistivity, and the second metal layers 640*a*, 640*b*, and 640*c* may be formed of copper having relatively low resistivity.

In some example embodiments, although only the first metal layers 630*a*, 630*b*, and 630*c* and the second metal layers 640*a*, 640*b*, and 640*c* are shown and described, the example embodiments are not limited thereto, and one or more additional metal layers may be further formed on the second metal layers 640*a*, 640*b*, and 640*c*. At least a portion of the one or more additional metal layers formed on the second metal layers 640*a*, 640*b*, and 640*c* may be formed of aluminum or the like having a lower resistivity than those of copper forming the second metal layers 640*a*, 640*b*, and 640*c*.

The interlayer insulating layer 615 may be disposed on the first substrate 610 and cover the plurality of circuit elements 620*a*, 620*b*, and 620*c*, the first metal layers 630*a*, 630*b*, and 630*c*, and the second metal layers 640*a*, 640*b*, and 640*c*. The interlayer insulating layer 615 may include an insulating material such as silicon oxide, silicon nitride, or the like.

Lower bonding metals 671*b* and 672*b* may be formed on the second metal layer 640*b* in the word line bonding area WLBA. In the word line bonding area WLBA, the lower bonding metals 671*b* and 672*b* in the peripheral circuit region PERI may be electrically bonded to upper bonding metals 571*b* and 572*b* of the cell region CELL. The lower bonding metals 671*b* and 672*b* and the upper bonding metals 571*b* and 572*b* may be formed of aluminum, copper, tungsten, or the like. Further, the upper bonding metals 571*b* and 572*b* in the cell region CELL may be referred as first metal pads and the lower bonding metals 5271*b* and 5272*b* in the peripheral circuit region PERI may be referred as second metal pads.

The cell region CELL may include at least one memory block. The cell region CELL may include a second substrate 510 and a common source line 520. On the second substrate 510, a plurality of word lines 531 to 538 (e.g., 530) may be stacked in a vertical direction VD, perpendicular to an upper surface of the second substrate 510. At least one string select line and at least one ground select line may be arranged on and below the plurality of word lines 530, respectively, and the plurality of word lines 530 may be disposed between the at least one string select line and the at least one ground select line.

In the bit line bonding area BLBA, a channel structure CHS may extend in the vertical direction VD, perpendicular to the upper surface of the second substrate 510, and pass through the plurality of word lines 530, the at least one string select line, and the at least one ground select line. The channel structure CHS may include a data storage layer, a channel layer, a buried insulating layer, and the like, and the channel layer may be electrically connected to a first metal layer 550*c* and a second metal layer 560*c*. For example, the first metal layer 550*c* may be a bit line contact, and the second metal layer 560*c* may be a bit line. In some example embodiments, the bit line 560*c* may extend in a second horizontal direction HD2, parallel to the upper surface of the second substrate 510.

In some example embodiments, an area in which the channel structure CHS, the bit line 560*c*, and the like are disposed may be defined as the bit line bonding area BLBA. In the bit line bonding area BLBA, the bit line 560*c* may be electrically connected to the circuit elements 620*c* providing a page buffer 593 in the peripheral circuit region PERI. The bit line 560*c* may be connected to upper bonding metals 571*c* and 572*c* in the cell region CELL, and the upper bonding metals 571*c* and 572*c* may be connected to lower bonding metals 671*c* and 672*c* connected to the circuit elements 620*c* of the page buffer 593.

In the word line bonding area WLBA, the plurality of word lines 530 may extend in a first horizontal direction HD1, parallel to the upper surface of the second substrate 510, and may be connected to a plurality of cell contact plugs 541 to 547 (e.g., 540). The plurality of word lines 530 and the plurality of cell contact plugs 540 may be connected to each other in pads provided by at least a portion of the plurality of word lines 530 extending in different lengths in the second horizontal direction HD2. A first metal layer 550*b* and a second metal layer 560*b* may be connected to an upper portion of the plurality of cell contact plugs 540 connected to the plurality of word lines 530, sequentially. The plurality of cell contact plugs 540 may be connected to the peripheral circuit region PERI by the upper bonding metals 571*b* and 572*b* of the cell region CELL and the lower bonding metals 671*b* and 672*b* of the peripheral circuit region PERI in the word line bonding area WLBA.

The plurality of cell contact plugs 540 may be electrically connected to the circuit elements 620*b* providing a row decoder 594 in the peripheral circuit region PERI. In some example embodiments, operating voltages of the circuit elements 620*b* of the row decoder 594 may be different than operating voltages of the circuit elements 620*c* providing the page buffer 593. For example, operating voltages of the circuit elements 620*c* providing the page buffer 593 may be greater than operating voltages of the circuit elements 620*b* providing the row decoder 594.

A common source line contact plug 580 may be disposed in the external pad bonding area PA. The common source line contact plug 580 may be formed of a conductive material such as a metal, a metal compound, polysilicon, or the like, and may be electrically connected to the common source line 520. A first metal layer 550*a* and a second metal layer 560*a* may be stacked on an upper portion of the common source line contact plug 580, sequentially. For example, an area in which the common source line contact plug 580, the first metal layer 550*a*, and the second metal layer 560*a* are disposed may be defined as the external pad bonding area PA.

Input-output pads 605 and 505 may be disposed in the external pad bonding area PA. A lower insulating film 601 covering a lower surface of the first substrate 610 may be formed below the first substrate 610, and a first input-output pad 605 may be formed on the lower insulating film 601. The first input-output pad 605 may be connected to at least one of the plurality of circuit elements 620a, 620b, and 620c disposed in the peripheral circuit region PERI through a first input-output contact plug 603, and may be separated from the first substrate 610 by the lower insulating film 601. In addition, a side insulating film may be disposed between the first input-output contact plug 603 and the first substrate 610 to electrically separate the first input-output contact plug 603 and the first substrate 610.

An upper insulating film 501 covering the upper surface of the second substrate 510 may be formed on the second substrate 510, and a second input-output pad 505 may be disposed on the upper insulating layer 501. The second input-output pad 505 may be connected to at least one of the plurality of circuit elements 620a, 620b, and 620c disposed in the peripheral circuit region PERI through a second input-output contact plug 503.

According to some example embodiments, the second substrate 510 and the common source line 520 may not be disposed in an area in which the second input-output contact plug 503 is disposed. Also, the second input-output pad 505 may not overlap the word lines 530 in the vertical direction VD. The second input-output contact plug 503 may be separated from the second substrate 510 in a direction, parallel to the upper surface of the second substrate 510, and may pass through an interlayer insulating layer of the cell region CELL to be connected to the second input-output pad 505.

According to some example embodiments, the first input-output pad 605 and the second input-output pad 505 may be selectively formed. For example, the memory device 400 may include only the first input-output pad 605 disposed on the first substrate 610 or the second input-output pad 505 disposed on the second substrate 510. Alternatively, the memory device 400 may include both the first input-output pad 605 and the second input-output pad 505.

A metal pattern provided on an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 500 may include a lower metal pattern 673a, corresponding to an upper metal pattern 572a formed in an uppermost metal layer of the cell region CELL, and having the same cross-sectional shape as the upper metal pattern 572a of the cell region CELL so as to be connected to each other, in an uppermost metal layer of the peripheral circuit region PERI. In the peripheral circuit region PERI, the lower metal pattern 673a formed in the uppermost metal layer of the peripheral circuit region PERI may not be connected to a contact. Similarly, in the external pad bonding area PA, an upper metal pattern, corresponding to the lower metal pattern formed in an uppermost metal layer of the peripheral circuit region PERI, and having the same shape as a lower metal pattern of the peripheral circuit region PERI, may be formed in an uppermost metal layer of the cell region CELL.

The lower bonding metals 671b and 672b may be formed on the second metal layer 640b in the word line bonding area WLBA. In the word line bonding area WLBA, the lower bonding metals 671b and 672b of the peripheral circuit region PERI may be electrically connected to the upper bonding metals 571b and 572b of the cell region CELL by a Cu-to-Cu bonding.

Further, in the bit line bonding area BLBA, an upper metal pattern 592, corresponding to a lower metal pattern 652 formed in the uppermost metal layer of the peripheral circuit region PERI, and having the same cross-sectional shape as the lower metal pattern 652, may be formed in an uppermost metal layer of the cell region CELL. A contact may not be formed on the upper metal pattern 592 formed in the uppermost metal layer of the cell region CELL.

Figure 18:
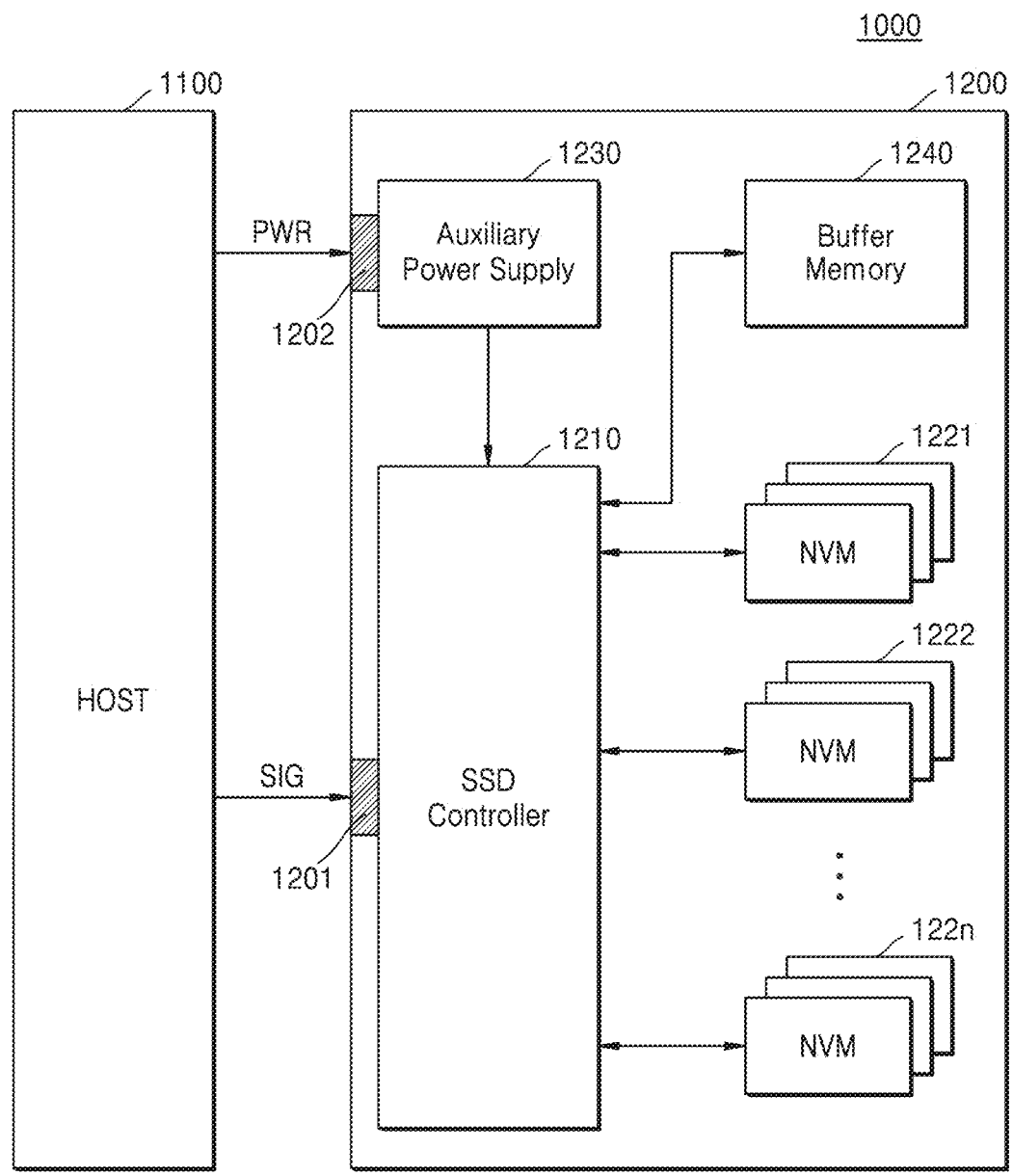
FIG. 18 is a block diagram showing an SSD system to which a memory device according to some example embodiments of the inventive concepts are applied.

FIG. 18 is a block diagram showing an SSD system to which a memory device according to some example embodiments of the inventive concepts are applied.

Referring to FIG. 18, an SSD system 1000 may include a host 1100 and an SSD 1200. The SSD 1200 exchanges signals SIG with the host 1100 through a signal connector 1201 and receives power PWR through a power connector 1202. The SSD 1200 may include an SSD controller 1210, an auxiliary power supply device 123, and a plurality of memory devices 1221, 1222, and 122n. The memory devices 1221, 1222, and 122n may be vertically stacked NAND flash memory devices. Here, the SSD 1200 may be implemented according to the embodiments described above with reference to FIGS. 1 to 17.

The memory system 10 (or other circuitry, for example, the memory device 100, control logic circuit 120, page buffer circuit 130, memory controller 200, SSD system 1000, host 1100, SSD 1200, or SSD controller 1210) may include hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While the inventive concepts have been particularly shown and described with reference to some example embodiments thereof, it will be understood that various changes in form and details may be made therein without departing from the spirit and scope of the following claims.

What is claimed is:

1. A non-volatile memory device comprising:
a memory cell array including a plurality of cell strings, each cell string extending in a vertical direction above a substrate and each cell string including a plurality of memory cells respectively connected to a plurality of word lines and a string select transistor connected to a string select line;
a page buffer circuit including a plurality of page buffers connected to the memory cell array, each page buffer including a forcing latch configured to store forcing information and each page buffer is connected to a selected cell string through a bit line; and
a control logic circuit configured to, during a program operation on a selected word line, control at least two of a first voltage applied to the string select line in a first interval before a bit line forcing operation for transferring the forcing information to the selected cell string through the bit line, a second voltage applied to the string select line in a second interval in which the bit line forcing operation is performed, and a third voltage applied to the string select line in a third interval after the bit line forcing operation is performed, to be different from each other.

2. The non-volatile memory device of claim 1, wherein the control logic circuit is further configured to control the first voltage and the second voltage, such that a voltage level of the first voltage is higher than a voltage level of the second voltage.

3. The non-volatile memory device of claim 1, wherein the control logic circuit is further configured to control the second voltage and the third voltage, such that a voltage level of the second voltage is higher than a voltage level of the third voltage.

4. The non-volatile memory device of claim 1, wherein the word lines comprise a first word line relatively close to the substrate and a second word line relatively far from the substrate, and
the first voltage based on the selected word line corresponding to the first word line and the first voltage based on the selected word line corresponding to the second word line have different voltage levels.

5. The non-volatile memory device of claim 1, wherein each of the page buffers further includes a bit line shut-off transistor configured to be driven according to a bit line shut-off signal, and
a bit line shut-off voltage corresponding to the bit line shut-off signal corresponds to a bit line forcing voltage in the second interval, and, in the second interval, each of the page buffers is electrically connected to the bit line and configured to transfer the forcing information to the selected cell string.

6. The non-volatile memory device of claim 5, wherein a program voltage is configured to be applied to the selected word line in the first interval, the second interval, and the third interval.

7. The non-volatile memory device of claim 5, wherein each of the page buffers further includes a sensing latch configured to store bit line setup information, and
the bit line shut-off voltage corresponds to a bit line setup voltage in a bit line setup interval before the first interval, and, in the bit line setup interval, each of the page buffers is electrically connected to the bit line and configured to transfer the bit line setup information to the selected cell string.

8. The non-volatile memory device of claim 7, wherein in the bit line setup interval, a power supply voltage is configured to be applied to the selected word line.

9. The non-volatile memory device of claim 7, wherein in the program operation, the control logic circuit is further configured to control a fourth voltage applied to the string select line in the bit line setup interval to be different from at least one of the first voltage, the second voltage, and the third voltage.

10. The non-volatile memory device of claim 9, wherein the word lines comprise a first word line relatively close to the substrate and a second word line relatively far from the substrate, and
the fourth voltage based on the selected word line corresponding to the first word line and the fourth voltage based on the selected word line corresponding to the second word line have different voltage levels.

11. The non-volatile memory device of claim 1, wherein each of the cell strings comprises a plurality of memory stacks including a first memory stack extending in the vertical direction above the substrate and a second memory stack extending in the vertical direction above the first memory stack,
the word lines comprise a first word line connected to the first memory stack, a second word line connected to the first memory stack and above the first word line, a third word line connected to the second memory stack and above the second word line, and a fourth word line connected to the second memory stack and above the third word line, and
the control logic circuit is further configured to differently control at least one of the first voltage, the second voltage, and the third voltage with respect to first to fourth word lines.

12. A non-volatile memory device comprising:
a plurality of word lines including a first word line relatively close to a substrate and a second word line relatively far from the substrate;
a memory cell array including a plurality of cell strings, each cell string extending in a vertical direction above the substrate and each cell string including a plurality of memory cells respectively connected to the word lines;
a page buffer circuit including a plurality of page buffers connected to the memory cell array, each page buffer being connected to a selected cell string through a bit line and including a bit line shut-off transistor configured to be driven in response to a bit line shut-off signal and a forcing latch configured to store forcing information; and
a control logic circuit configured to, during a program operation on a selected word line, control a delay interval in which a bit line shut-off voltage corresponding to the bit line shut-off signal maintains a voltage level corresponding to a ground voltage before a bit line forcing operation of transferring the forcing information to the selected cell string through the bit line is performed,
a length of the delay interval based on the selected word line corresponding to the first word line being longer than a length of the delay interval based on the selected word line corresponding to the second word line.

13. The non-volatile memory device of claim 12, wherein the control logic circuit is further configured to control a step waveform in which the bit line shut-off voltage rises from the ground voltage to the bit line forcing voltage during the program operation.

14. The non-volatile memory device of claim 13, wherein the step waveform comprises a plurality of steps, and
the control logic circuit is further configured to control at least one of a cycle corresponding to a maintenance interval of each of the steps and a step corresponding to a voltage difference between the steps.

15. The non-volatile memory device of claim 14, wherein a length of the cycle based on the selected word line corresponding to the first word line is different from a length of the cycle based on the selected word line corresponding to the second word line.

16. The non-volatile memory device of claim 14, wherein a size of the step based on the selected word line corresponding to the first word line is different from a size of the step based on the selected word line corresponding to the second word line.

17. The non-volatile memory device of claim 13, wherein in an interval in which the bit line shut-off voltage corresponds to the bit line forcing voltage, each of the page buffers is electrically connected to the bit line and configured to transfer the forcing information to the selected cell string.

18. A non-volatile memory device comprising:
a plurality of word lines including a first group including word lines relatively close to a substrate and a second group including word lines relatively far from the substrate;
a string select line above the plurality of word lines;
a memory cell array including a plurality of cell strings, each cell string extending in a vertical direction above the substrate and each cell string being connected to the plurality of word lines and the string select line;
a page buffer circuit including a plurality of page buffers connected to the memory cell array, each page buffer being connected to a selected cell string through a bit line and including a bit line shut-off transistor configured to be driven in response to a bit line shut-off signal and a forcing latch configured to store forcing information; and
a control logic circuit configured to, in a program operation on a selected word line, control a voltage applied to the string select line to perform a bit line forcing operation of transferring the forcing information to the selected cell string through the bit line and a bit line shut-off voltage corresponding to the bit line shut-off signal,
the control logic circuit being further configured to
control a first voltage applied to the string select line in a first interval before the bit line forcing operation is performed differently with respect to the first group and the second group, and
control a delay interval in which the bit line shut-off voltage maintains a voltage level corresponding to a ground voltage before the bit line forcing operation is performed differently with respect to the first group and the second group.

19. The non-volatile memory device of claim 18, wherein the control logic circuit is further configured to
control a second voltage applied to the string select line in a second interval in which the bit line forcing operation is performed differently with respect to the first group and the second group, and
control a third voltage applied to the string select line in a third interval after the bit line forcing operation is performed differently with respect to the first group and the second group.

20. The non-volatile memory device of claim 18, wherein the control logic circuit is further configured to control a step waveform in which the bit line shut-off voltage rises from the ground voltage to the bit line forcing voltage during the program operation,
the step waveform comprises a plurality of steps,
the control logic circuit is further configured to
control a cycle corresponding to a maintenance interval of each of the steps differently for the first group and the second group, and
control a step corresponding to a voltage difference between the steps differently for the first group and the second group.

* * * * *